United States Patent
Wakimoto et al.

(10) Patent No.: US 11,385,297 B2
(45) Date of Patent: Jul. 12, 2022

(54) ELECTRICAL LEAKAGE DETERMINATION SYSTEM

(71) Applicant: DENSO CORPORATION, Kariya (JP)

(72) Inventors: Toru Wakimoto, Nisshin (JP); Yusuke Shindo, Kariya (JP); Masakazu Kouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 107 days.

(21) Appl. No.: 16/654,222

(22) Filed: Oct. 16, 2019

(65) Prior Publication Data

US 2020/0116775 A1   Apr. 16, 2020

(30) Foreign Application Priority Data

Oct. 16, 2018  (JP) .............................. JP2018-195395
Apr. 24, 2019  (JP) .............................. JP2019-083425

(51) Int. Cl.
  *G01R 31/50*  (2020.01)
  *G01R 31/42*  (2006.01)
  *G01R 31/52*  (2020.01)

(52) U.S. Cl.
  CPC ............. *G01R 31/50* (2020.01); *G01R 31/42* (2013.01); *G01R 31/52* (2020.01)

(58) Field of Classification Search
  CPC ...... G01R 27/18; G01R 27/025; G01R 31/52; G01R 31/006; G01R 31/007; G01R 31/396; G01R 31/50; G01R 31/40; G01R 31/3835; G01R 35/00; G01R 31/005; G01R 31/14; G01R 31/1272; G01R 31/382;

(Continued)

(56) References Cited

U.S. PATENT DOCUMENTS 5,541,547 A * 7/1996 Lam .................... G01R 31/2853
                                                   250/358.1
2004/0227521 A1* 11/2004 Higashihama ......... G01R 31/40
                                                   324/522

(Continued)

FOREIGN PATENT DOCUMENTS

JP   H11-218554 A   8/1999
JP   2001-242205 A  9/2001

(Continued)

*Primary Examiner* — Yoshihisa Ishizuka
*Assistant Examiner* — Carter W Ferrell
(74) *Attorney, Agent, or Firm* — Oliff PLC

(57) ABSTRACT

An electrical leakage determination system determines if an electrical leakage occurs between each of power supply paths and a grounding section. The electrical leakage determination system includes a coupling capacitor with one end connected to an anode-side power supply path, a resistor connected to the other end of the coupling capacitor, and an oscillator connected to the resistor to output an AC voltage to the resistor. A determiner detects a voltage at a connection point located between the coupling capacitor and the resistor when the oscillator outputs an AC voltage to the resistor. The determiner determines if the electrical leakage occurs based on the detected voltage. The oscillator increases an absolute value of an AC voltage output during a preparation period provided prior to a detection timing when a voltage is detected at a connection point greater than an absolute value of an AC voltage output at the detection timing.

16 Claims, 18 Drawing Sheets

(58) Field of Classification Search
CPC . G01R 19/16542; G01R 27/16; B60L 3/0069;
B60L 3/04; B60L 2240/547; B60L
3/0023; B60L 3/0046; B60L 50/51; B60L
2250/10; B60L 3/12; B60L 2240/80;
B60L 58/21; B60L 2250/16; Y02T 10/70;
Y02T 10/7072; Y02T 90/14; Y02T 10/72;
Y02T 90/12
See application file for complete search history.

(56) References Cited

U.S. PATENT DOCUMENTS

| | | | | |
|---|---|---|---|---|
| 2004/0239346 | A1* | 12/2004 | Iyer | G01R 27/02 |
| | | | | 324/713 |
| 2007/0008666 | A1* | 1/2007 | Morita | B60L 3/0023 |
| | | | | 361/42 |
| 2009/0134881 | A1* | 5/2009 | Tachizaki | B60L 3/0023 |
| | | | | 324/551 |
| 2010/0231284 | A1* | 9/2010 | Jacobson | H02H 9/08 |
| | | | | 327/307 |
| 2014/0002096 | A1* | 1/2014 | Mizoguchi | G01R 31/52 |
| | | | | 324/503 |
| 2014/0333321 | A1* | 11/2014 | Kawamura | B60L 3/04 |
| | | | | 324/509 |
| 2015/0293167 | A1* | 10/2015 | Kawamura | B60L 3/0069 |
| | | | | 324/551 |
| 2016/0202301 | A1 | 7/2016 | Mizoguchi et al. | |
| 2016/0377670 | A1* | 12/2016 | Tamida | G01R 31/52 |
| | | | | 324/551 |
| 2017/0108556 | A1* | 4/2017 | Yamamoto | G01R 31/364 |

FOREIGN PATENT DOCUMENTS

| | | |
|---|---|---|
| JP | 2003-250201 A | 9/2003 |
| JP | 2006-078449 A | 3/2006 |
| JP | 2012-037278 A | 2/2012 |
| JP | 2012-168070 A | 9/2012 |
| JP | 2014-095628 A | 5/2014 |
| JP | 2014-155329 A | 8/2014 |
| JP | 2016-080526 A | 5/2016 |
| JP | 2016-118522 A | 6/2016 |
| JP | 2016-152688 A | 8/2016 |

* cited by examiner

ELECTRICAL LEAKAGE DETERMINATION SYSTEM

CROSS-REFERENCE TO RELATED APPLICATIONS

This application is based on and claims the benefit of priority from earlier Japanese Patent Application No. 2018-195395 filed on Oct. 16, 2018 and Japanese Patent Application No. 2019-083425 filed on Apr. 24, 2019, the descriptions of which are incorporated herein by reference.

BACKGROUND

Technical Field

Embodiments of this disclosure relate to an electrical leakage determination system.

Related Art

As an electrical leakage determination system (i.e., a ground fault detection system for a vehicle) that determines if an electrical leakage occurs (i.e., not an insulation state) in an electric system mounted on a vehicle based on a decrease in ground fault resistance is known. For example, it is discussed in JP-2003-250201-A that a rectangular wave is output to a signal line connected to the electric system and it is determined if an electrical leakage occurs based on a voltage value (a crest value) of the rectangular wave in the signal line.

In the electrical leakage determination system of JP-2003-250201-A, a first voltage is measured at a time point at which a phase of a rectangular wave becomes a first phase, and a second voltage is measured at a time point at which the phase of the rectangular wave becomes a second phase. Subsequently, a differential voltage therebetween is calculated, and it is determined if an electrical leakage occurs based on a magnitude of the differential voltage. With this, generation of a ground fault and an increase in electric capacity of a vehicle (i.e., a ground capacitance) is detected.

In general, when the ground capacitance increases, a rectangular wave slowly rises (a CR time constant becomes greater), thereby increasing a detection error while decreasing detection accuracy. In such a situation, it is possible to reduce the error by elongating a period from when the rectangular wave starts rising until a voltage is detected. However, in such a situation, since it takes a longer time to detect the voltage, determination needs a longer period as a problem.

The present disclosure has been made in view of the above-described problems, and it is an object of the present disclosure to provide an electrical leakage determination system capable of improving determination accuracy while shortening a determination period even if a ground capacitance becomes relatively larger.

SUMMARY

Accordingly, to determine if an electrical leakage occurs between a power supply path connected to a power supply terminal of a DC power supply and a grounding section while solving the above-described problems, one aspect of the present disclosure provides a novel electrical leakage determination system that includes a coupling capacitor with its one end connected to the power supply path, a resistor connected to the other end of the coupling capacitor, and an oscillator connected to the resistor to output an AC voltage to the resistor. The electrical leakage determination system further includes a determiner to detect a voltage at a connection point provided between the coupling capacitor and the resistor when the oscillator outputs an AC voltage to the resistor. The determiner subsequently determines if the electrical leakage occurs based on the voltage detected in this way. The oscillator is controlled to output a greater absolute value of the AC voltage during a preparation period provided prior to a detection timing when the voltage is detected than an absolute value of the AC voltage output at the detection timing.

When a voltage is output on a condition that a ground capacitance is relatively larger, a voltage detected at the connection point (M2) gradually changes as time elapses due to an influence of charging of the ground capacitance. Specifically, the CR time constant becomes greater. To solve such a problem, according to another aspect of the present disclosure outputs a greater absolute value of the AC voltage during the preparation period provided prior to the detection timing than the absolute value of the AC voltage output at the detection timing to allow the ground capacitance to charge within a short period prior to the detection timing. With this, it is possible to either suppress or reduce an influence and a detection error caused by the ground capacitance and improve determination accuracy. Further, as a result of increasing the absolute value during the preparation period and thereby quickly completed charging of the ground capacitance, it is again possible to substantially eliminate influence of charging of the ground capacitance. As a result, the detection timing can be set at an earlier stage and accordingly a determination period can be shortened more than when the greater voltage value is not provided in the preparation period.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Figure 1:
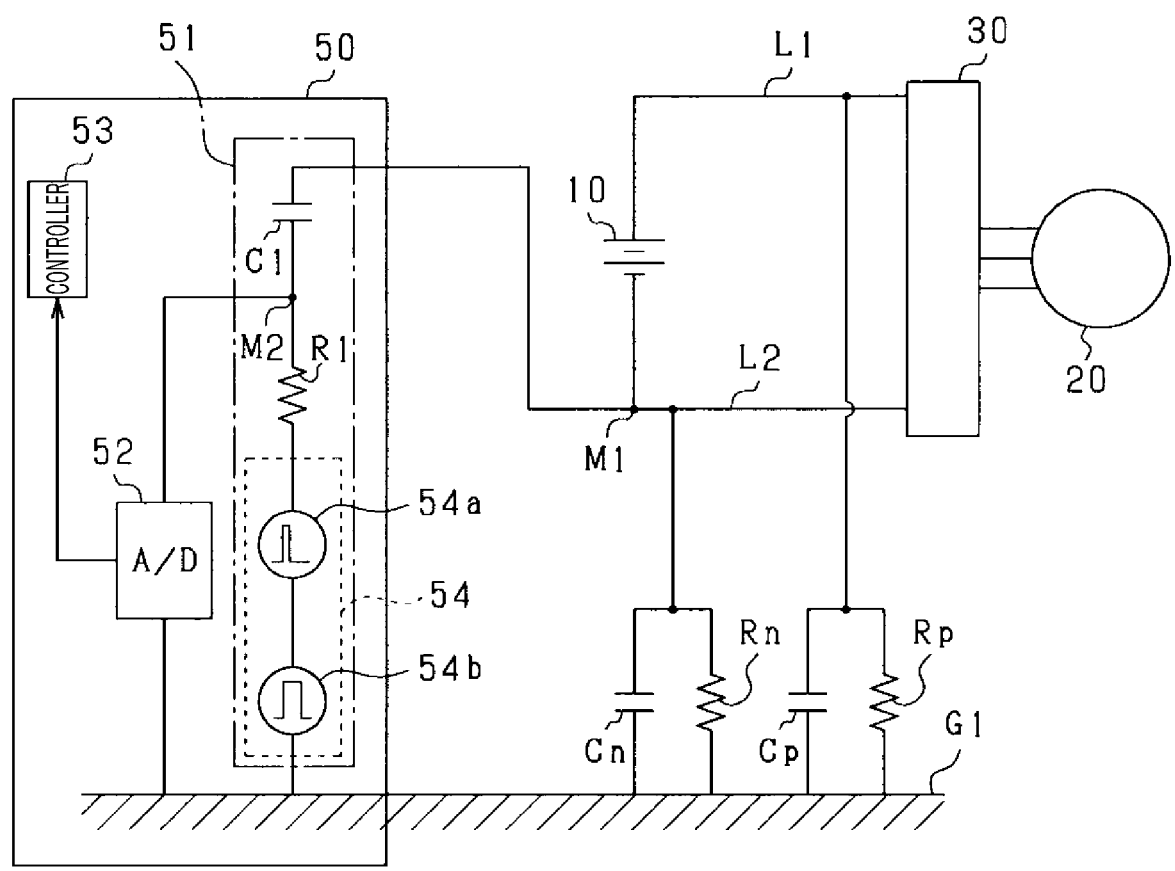
FIG. 1 is a diagram illustrating an electric circuit of an electrical leakage determination system according to a first embodiment of the present disclosure.

Referring now to the drawings, wherein like reference numerals designate identical or corresponding parts throughout the several views thereof, and to FIG. 1, a first embodiment of the present disclosure is described.

The first embodiment of the present disclosure is applied to a vehicle (for example, a hybrid car and an electric motor car) including an electric rotary motor acting as a primary in-vehicle machine with an electrical leakage determination system.

As illustrated in FIG. 1, an in-vehicle motor control system is provided in this embodiment and includes an assembled battery 10, a motor 20 and an inverter 30. The in-vehicle motor control system also includes an electrical leakage determination system 50.

The assembled battery 10 is electrically connected to the motor 20 via the inverter 30. The assembled battery 10 is, for example, a secondary battery having more than 100V across terminals and is configured by connecting multiple battery modules in series with each other. Each of the battery modules is configured by connecting multiple battery cells in series with each other as well. As the battery cell, a lithium-ion secondary battery and a nickel hydride secondary battery can be used, for example. Hence, the assembled battery 10 corresponds to a DC (direct current) power supply.

The motor 20 acts as a primary in-vehicle machine and is enabled to transmit power to drive wheels (not illustrated). In this embodiment of the present disclosure, a three-phase permanent magnet synchronous motor is used as the motor 20.

The inverter 30 is composed of a full-bridge circuit having the same numbers of upper and lower arms as the numbers of phases of windings. An energization current is adjusted in each of the windings by turning on/off switches (e.g., semiconductor switching elements) provided in each of the arms.

Further, an inverter control system (not shown) is provided in the inverter 30. The inverter control system performs energization control by turning on/off switches provided in the inverter 30 based on various detection information and requests for power running drive and power generation in the motor 20. With this, the inverter control system supplies power from the assembled battery 10 to the motor 20 via the inverter 30 to let the motor 20 perform the power running drive. Further, the inverter control system also lets the motor 20 perform the power generation based on motive power transmitted from the drive wheels, converts electric power generated in this way, and supplies a conversion result to the assembled battery 10 via the inverter 30, thereby charging the assembled battery 10.

A cathode-side terminal of an electrical load such as the inverter 30, etc., is connected to a cathode-side power supply path L1 connected to a cathode side power supply terminal of the assembled battery 10. The cathode-side power supply path L1 is electrically insulated from a grounding section G1 of the car body or the like. Such an insulation state (a ground insulation resistance) between the cathode-side power supply path L1 and the grounding section G1 can be represented by a ground fault resistance Rp. Further, between the cathode-side power supply path L1 and the grounding section G1, a ground capacitance, such as a capacitor for noise removal, a stray capacity, etc., exists, and is collectively represented by a ground capacitance Cp.

An anode-side terminal of an electrical load such as the inverter 30, etc., is connected to an anode-side power supply path L2 connected to an anode-side power supply terminal of the assembled battery 10. The anode-side power supply path L2 is also electrically insulated from the grounding section G1. Such an insulation state (i.e., a ground insulation resistance) between the anode-side power supply path L2 and the grounding section G1 can be represented by a ground fault resistance Rn. Further, between the anode-side power supply path L2 and the grounding section G1, a ground capacitance, such as a capacitor for noise removal, a stray capacity, etc., exists and is collectively represented by a ground capacitance Cn.

Herein below, the ground fault resistances Rp and Rn are sometimes collectively referred to as a ground fault resistance Rx. The ground capacitances Cp and Cn are collectively referred to as a ground capacitance Cx.

The electrical leakage determination system 50 is connected to any one of the cathode-side power supply path L1 and the anode-side power supply path L2 and determines if the cathode-side power supply path L1 and the anode-side power supply path L2 are correctly insulated from the grounding section G1. Specifically, the electrical leakage determination system 50 determines if an electrical leakage occurs as described herein below.

That is, the electrical leakage determination system 50 includes a circuit section 51, an A/D (analog to digital) converter 52 as a voltage detector, and a controller 53 acting as a determiner.

The circuit section 51 includes an oscillator 54 which outputs an AC (alternating current) voltage (i.e., an AC signal) having a given frequency, a resistor R1 and a coupling capacitor C1. The oscillator 54, the resistor R1 and the coupling capacitor C1 are connected in series. One end of the oscillator 54 is connected to the coupling capacitor C1 via the resistor R1. The coupling capacitor C1 is connected to a connection point M1 in the anode-side power supply path L2. The coupling capacitor C1 allows an AC component to pass while blocking a DC component when these components are communicated between the electrical leakage determination system 50 categorized as a low-voltage circuit and each of the assembled battery 10, the inverter 30 and the motor 20 categorized as high-voltage circuits. The other end of the oscillator 54 is connected to the grounding section G1.

Further, one end of the A/D converter 52 is connected to a connection point M2 provided between the resistor R1 and the coupling capacitor C1. The other end of the A/D converter 52 is connected to the grounding section G1. The A/D converter 52 is configured to convert a signal (i.e., an analog signal) input thereto via the connection point M2 into another signal (i.e., a digital signal) suitable for processing performed by the controller 53. The A/D converter 52 subsequently outputs a result of the conversion.

When the oscillator 54 outputs an AC voltage via the resistor R1 and the coupling capacitor C1, a voltage (i.e., a detected voltage) detected at the connection point M2 is calculated by dividing the AC voltage output by the oscillator 54 by a ratio between a resistance value of the resistor R1 and the ground fault resistance Rx. Hence, the A/D converter 52 receives the voltage detected (i.e., calculated) in this way as an input thereto. As described later in detail with reference to FIG. 20, a bandpass filter 55 may be provided between the connection point M2 and the A/D converter 52.

The controller 53 is mainly configured by a microcomputer including a CPU (central processing unit), a ROM (read only memory), and a RAM (random access memory). The controller 53 is also configured by an I/O (input and output) ports or the like. The controller 53 achieves various functions when the CPU runs program stored in the ROM. Here, the various functions can be achieved by an electronic circuit as a hardware. Otherwise, the various functions can be at least partially achieved by data processing of a computer using software.

The controller 53 detects a voltage at the connection point M2 and determines a level of an insulation state of a high-voltage circuit based on a result of detection of the voltage. Specifically, the controller 53 determines if an electrical leakage occurs. The determination can be made by comparing the voltage value detected at the connection point M2 with a threshold. Otherwise, the controller 53 can determine if the electrical leakage occurs by obtaining a value of the ground fault resistance Rx based on a ratio between the voltage value detected at the connection point M2 and a value of an AC voltage output by the oscillator 54.

When it determines that the electrical leakage occurs, the controller 53 executes various processing in accordance with a level of electrical leakage. For example, the controller 53 may either output an alarm or shut down energization between the high-voltage circuit and the assembled battery 10 to stop supplying power from the assembled battery 10 and inhibit charging.

Figure 2A:
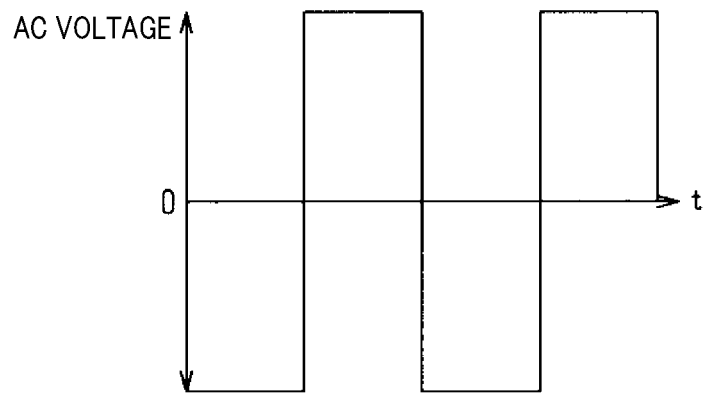
FIG. 2A is a time chart illustrating an AC voltage employed in a related art.
Figure 2B:
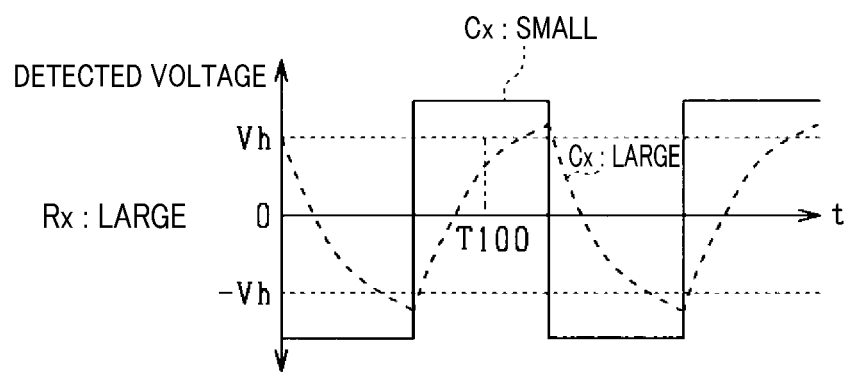
FIGS. 2B and 2C are time charts respectively illustrating temporal changes in detected voltage in the related art.

In general, a pulse signal having a rectangular wave is commonly used when an AC voltage is output by the oscillator 54 as illustrated in FIG. 2A. However, a temporal change in detected voltage (i.e., a magnitude of a CR time constant) varies in accordance with a value of the ground capacitance Cx and an amount of charge in the ground capacitance Cx as described in more detail with reference to FIGS. 2B and 2C. That is, FIG. 2B illustrates a temporal change in detected voltage when the ground fault resistance Rx is relatively large (i.e., an insulation state is maintained). By contrast, FIG. 2C illustrates a temporal change in detected voltage when the ground fault resistance Rx is relatively small (i.e., an electrical leakage occurs).

Specifically, as indicated by a solid line in FIG. 2B, when the ground fault resistance Rx is relatively large and the ground capacitance Cx is relatively small, a voltage detected at the connection point (M2) temporally changes substantially in accordance with an output rectangular wave (i.e., an AC voltage). By contrast, as indicated by a broken line in FIG. 2B, when each of the ground fault resistance Rx and the ground capacitance Cx is relatively large, a voltage detected at the connection point (M2) temporally changes far behind the output rectangular wave. Specifically, the voltage slightly changes at beginning of transition and gradually changes subsequently as time elapses. For example, the voltage slightly increases at a start of rising and gradually increases subsequently as time elapses. Otherwise, the voltage slightly descends at a start of descending and gradually descends subsequently as time elapses.

Specifically, when the ground fault resistance Rx is relatively large, a waveform of a voltage detected at the connection point (M2) largely varies in accordance with a value of the ground capacitance Cx. Hence, even though the ground fault resistance Rx is relatively large, it can be erroneously determined that an electrical leakage occurs depending on a value of the ground capacitance Cx. For example, when a time point T100 is set as a detection timing, a voltage detected at the connection point (M2) can exceed a threshold Vh even when the ground capacitance Cx is relatively small and fall below the threshold Vh when the ground capacitance Cx is relatively large resulting in erroneous determination. Further, although the determination error can be reduced by delaying a detection period of the time point T100, a determination period needs to be elongated.

Figure 2C:
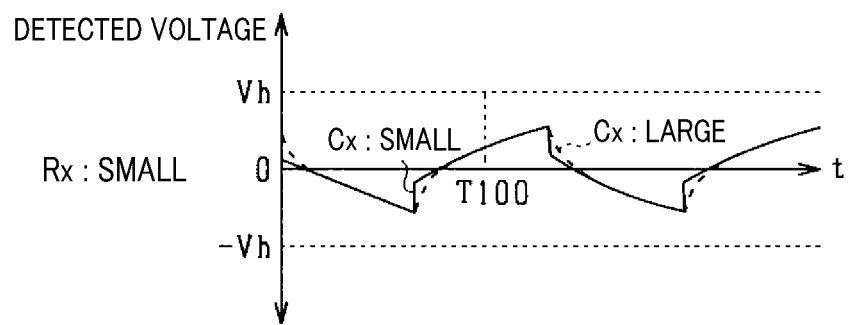

Further, when each of the ground fault resistance Rx and the ground capacitance Cx is relatively small, a voltage detected at the connection point (M2) temporally changes as indicated by a solid line in FIG. 2C. By contrast, as indicated by a broken line in FIG. 2C, when the ground fault resistance Rx is relatively small and the ground capacitance Cx is relatively large, although a phase of a waveform (a broken line) of a voltage detected at the connection point (M2) slightly delays at a beginning of transition from that of a waveform (a solid line) obtained when the ground capacitance Cx is relatively small, a voltage detected at the connection point (M2) substantially similarly changes temporarily. Hence, when the ground fault resistance Rx is relatively small, a detection error and accordingly erroneous determination caused by a difference in ground capacitance Cx can be minimized.

Hence, since erroneous determination can occur depending on a value of the ground capacitance Cx and the ground capacitance Cx of a hybrid car and an electric motor car tends to increase, a pulse signal having a rectangular wave used in the related art can rarely shorten a determination period while improving determination accuracy. In this respect, the electrical leakage determination system 50 of this embodiment is configured as described below.

Specifically, as illustrated in FIG. 1, the oscillator 54 includes a first AC power supply 54a and a second AC power supply 54b. Each of the first AC power supply 54a and the second AC power supply 54b is enabled to output a pulse signal (a voltage) of a rectangular wave. A pulse signal is output by the first AC power supply 54a in the same AC cycle as a pulse signal output by the second AC power supply 54b. However, these pulse signals have different waveforms, for example peak values or the like, from each other as described herein below more in detail.

Figure 3C:
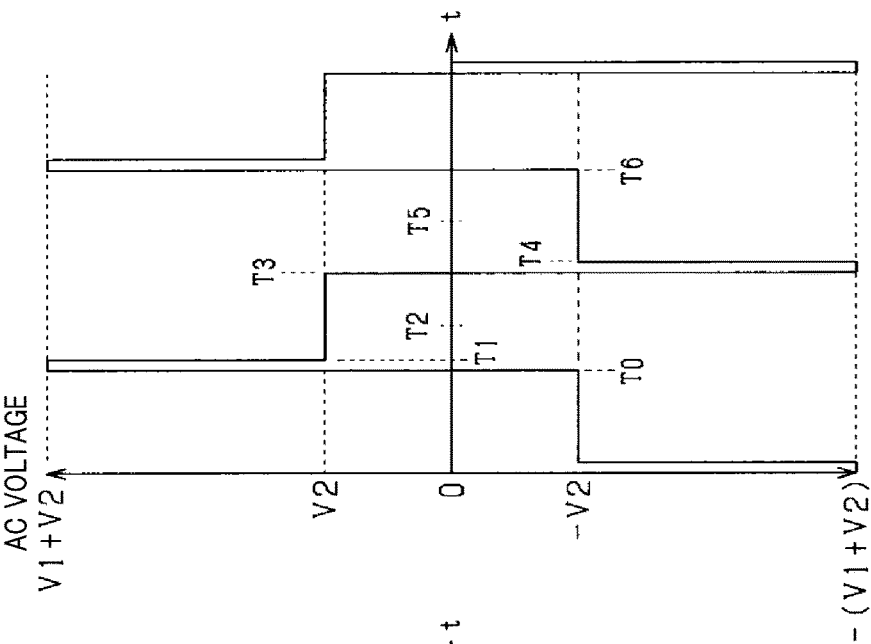
FIG. 3C is a time chart illustrating an AC voltage detected in the electrical leakage determination system according to the first embodiment of the present disclosure.
Figure 3B:
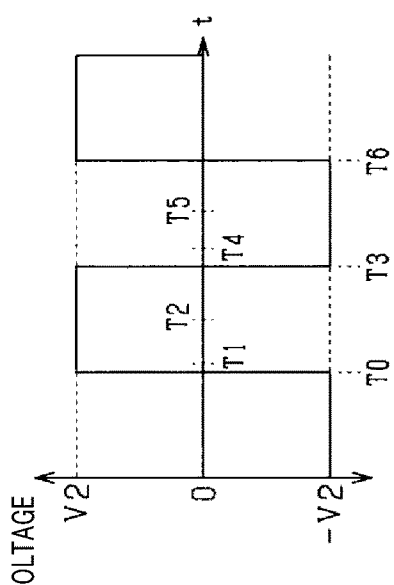
FIG. 3B is a time chart illustrating a second pulse signal used in the electrical leakage determination system according to the first embodiment of the present disclosure.
Figure 3A:
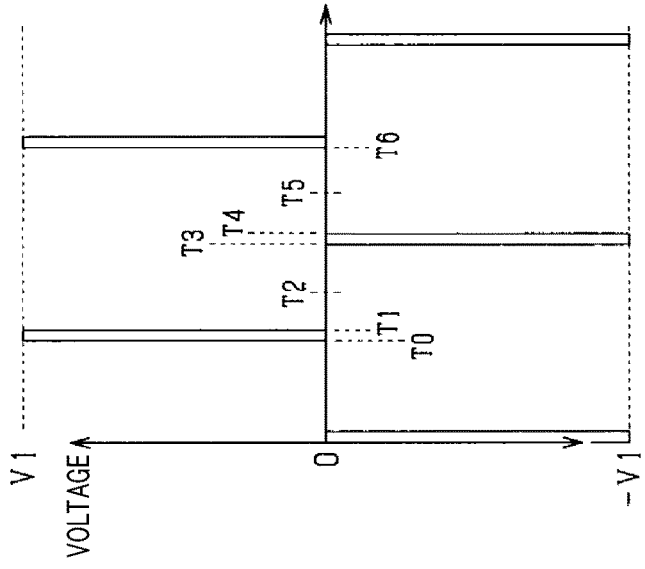
FIG. 3A is a time chart illustrating a first pulse signal used in the electrical leakage determination system according to the first embodiment of the present disclosure.

Specifically, as illustrated in FIG. 3A, a voltage value of the first pulse signal output by the first AC power supply 54a is V1 from a time point T0 at which an AC cycle starts until a time point T1. The voltage value of the first pulse signal subsequently becomes zero after the time point T1 until a time point T3 at which a last half of the AC cycle starts (i.e., until a first half of the AC cycle ends). Further, although it has an opposite polarity, a waveform of the first pulse signal in the last half of the AC cycle is substantially the same as a waveform of the first pulse signal in the first half of the AC cycle. Specifically, the first pulse signal has a waveform in which a voltage value is −V1 from the time point T3 at which the last half of the AC cycle starts until a time point T4 and becomes 0 after the time point T4 until a time point T6 at which the AC cycle ends.

Further, as illustrated in FIG. 3B, a voltage value of the second pulse signal output by the second AC power supply 54b is V2 from the time point T0 at which an AC cycle starts until the time point T3 at which a last half of the AC cycle starts. Further, although it has an opposite polarity, a waveform of the second pulse signal in the last half of the AC cycle is substantially the same as a waveform of the second pulse signal in the first half of the AC cycle. Specifically, the second pulse signal has a waveform in which a voltage value is −V2 from the time point T3 at which the last half of the C cycle starts until a time point T6 at which the AC cycle ends.

Further, as shown, the first pulse signal output from the first AC power supply 54a has a peak value greater than that of the first pulse signal output from the second AC power supply 54b. Specifically, an absolute value of V1 is greater than an absolute value of V2. By contrast, a period during which the first pulse signal is at its peak value (i.e., a period during which the absolute value is V1) is shorter than a period during which the second pulse signal is at its peak value (i.e., a period during which the absolute value is V2).

Further, the first AC power supply 54a is connected in series to the second AC power supply 54b. The first AC power supply 54a and the second AC power supply 54b respectively output pulse signals overlapping with each other from synchronous start times of the AC cycles. Hence, the oscillator 54 outputs an AC voltage (hereinafter referred to as a synthesized voltage) generated by synthesizing (or superimposing) the first pulse signal output from the first AC power supply 54a and the first pulse signal output from the second AC power supply 54b.

Further, as illustrated in FIG. 3C, a value of the synthesized AC voltage is V1+V2 from the time point T0 at which the AC cycle starts until the time point T1 and becomes V2 after the time point T1 until the time point T3 at which the last half of the AC cycle starts. A waveform of the synthesized voltage in the last half of the AC cycle is substantially the same as a waveform of the synthesized voltage in the first half of the AC cycle except for polarity. Specifically, the synthesized voltage has a waveform in which a voltage value is −(V1+V2) from the time point T3 at which the last half starts until the time point T4 and becomes −V2 after the time point T4 until the time point T6 at which the AC cycle ends. Such a synthesized voltage is output from the oscillator 54 as the AC voltage when it is determined if an electric leakage occurs.

Subsequently, in this embodiment, in the first half of the AC cycle, a value of the voltage (i.e., detected voltage) at the connection point M2 is detected when a given period has elapsed after the time point T1. Specifically, the value of the voltage at the connection point M2 is detected at the time point T2 between the time point T1 and the time point T3 at which the last half of the AC cycle starts. Further, in the last half of the AC cycle, a value of the voltage (i.e., detected voltage) at the connection point M2 is detected when a given period has elapsed after the time point T4. Specifically, the value of the voltage at the connection point M2 is detected at the time point T5 between the time point T4 and the time point T6 at which (the last half of) the AC cycle ends.

Hence, a period from the time point T0 to the time point T1 and a period from the time point T3 to the time point T4 correspond to the preparation periods, respectively. Further, an absolute value (an absolute value of V1+V2) of the AC voltage output during each of the preparation periods (i.e., the period from the time point T0 to the time point T1 and the period from the time point T3 to the time point T4) is greater than an absolute value of the AC voltage (i.e., an absolute value of V2 as the synthesized voltage) output at each of the detection timings (time points T2 and T5).

Figure 4A:
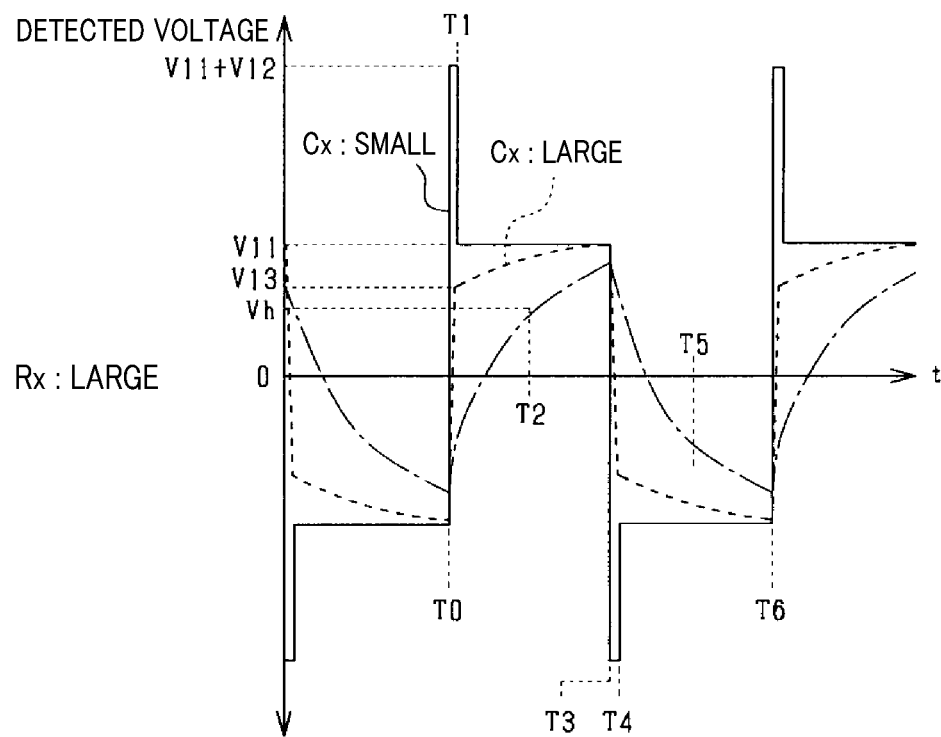
FIGS. 4A and 4B are time charts respectively illustrating temporal changes in detected voltage.
Figure 4B:
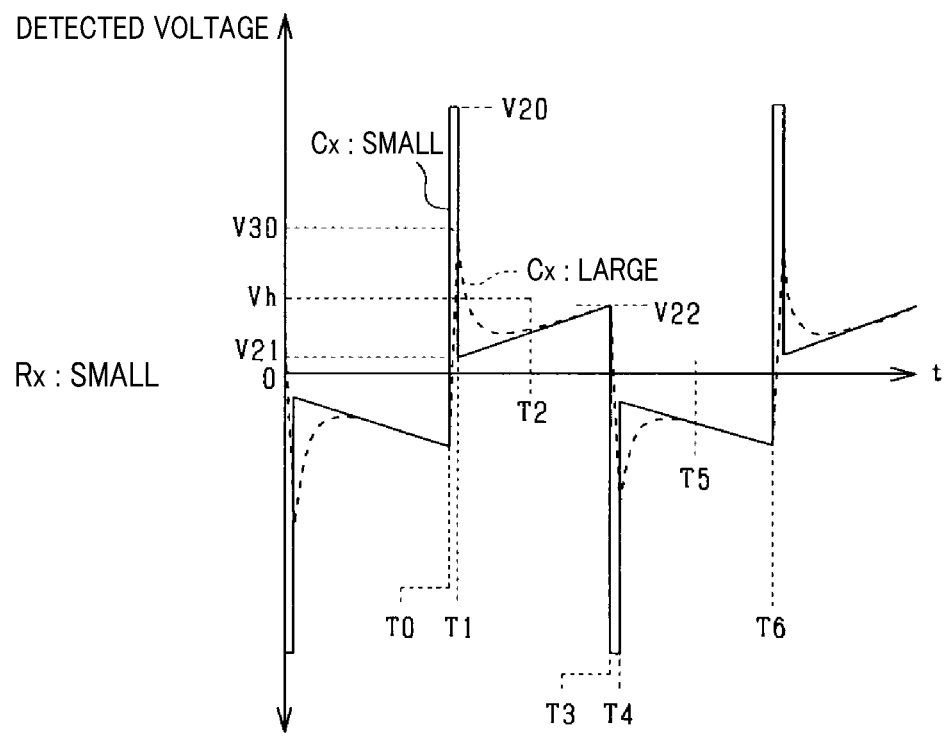

Hence, when such a synthesized voltage is output, the controller 5 can detect a voltage (hereinafter referred to as a detected voltage) having a waveform as illustrated in FIGS. 4A and 4B at the connection point M2 via the A/D converter 52. Specifically, FIG. 4A illustrates a temporal change in detected voltage when the ground fault resistance Rx is relatively large (i.e., insulation is achieved). FIG. 4B illustrates a temporal change in detected voltage when the ground fault resistance Rx is relatively small (i.e., an electrical leakage occurs). in the following description, because the last half of the AC cycle (from the time point T3 to the time point T6) is substantially the same as the first half of the AC cycle (from the time point T0 to the time point T3) except for polarity, the first half of the AC cycle is described while omitting description of the last half sometimes. Specifically, only a situation in which the AC voltage increases may be mainly described.

As indicated by a solid line in FIG. 4A, when the ground fault resistance Rx is relatively large and the ground capacitance Cx is relatively small, a voltage detected at the connection point (M2) temporally changes substantially in accordance with a synthesized voltage output as an AC voltage. Specifically, a value of the detected voltage is V11+V12 from the time point T0 at which the AC cycle starts until the time point T1. Subsequently, the value of the detected voltage becomes V11 from the time point T1 (when the preparation period has elapsed) until the time point T3 at which the last half of the AC cycle starts. Since a waveform of the last half of the AC cycle is substantially the same as a waveform of the first half except for polarity, the voltage value becomes −(V11+V12) from the time point T3 at which the last half starts until the time point T4. Subsequently, the voltage value becomes −V11 after the time point T4 until the time point T6 at which the AC cycle ends. Since the value V2 is equal to or greater than the value V11 and the value V1 is equal to or greater than the value V12 (i.e., V11≤V2 and V12≤V1), an inequality (V11+V12≤V1+V2) may be established.

Hence, when the ground fault resistance Rx is relatively large and the ground capacitance Cx is relatively small, a value of a voltage detected at the connection point (M2) at the detection timing (i. e., the time point T2) is V11. Since even though it is smaller than the voltage value V2, the voltage value V11 is greater than the threshold Vh, it is determined that the ground fault resistance Rx is relatively large.

By contrast, as indicated by the broken line in FIG. 4A, when the ground fault resistance Rx is relatively large and the ground capacitance Cx is also relatively large, a value of a voltage detected at the connection point (M2) is lower at the beginning transition (at a time a waveform starts rising) than that obtained when the ground capacitance Cx is relatively small. Specifically, the voltage value becomes V13 lower than the voltage value V11. However, the voltage value gradually increases so that a similar voltage value can be finally detected as detected when the ground capacitance Cx is relatively large.

Specifically, the value of the detected voltage sharply increases to be V13 in accordance with a change in synthesized voltage from the time point T0 at which the AC cycle starts until the time point T1. Here, the value V13 is at least smaller than the sum of V1+V2 and is equal to or less than the value V11 (i.e., V13<V11) in this embodiment. The voltage value gradually decreases to the value V11 after the time point T1 (i.e., after the preparation period has elapsed) until the time point T3 at which the last half of the AC cycle starts. However, because a waveform after the time point T3 at which the last half starts is substantially the same as the first half portion except for polarity, description thereof is herein below omitted.

Hence, when both of the ground fault resistance Rx and the ground capacitance Cx are relatively large, a value of a voltage detected at the connection point (M2) at the detection timing (the time point T2) is equal to or greater than V13. Because the voltage value V13 is greater than the threshold Vh even if the voltage value V13 is relatively smaller than the voltage value V11, it is determined that the ground fault resistance Rx is relatively large.

Now, the detected voltage of this embodiment is compared with a voltage detected in the related art as indicated by a broken line in FIG. 2B. In FIG. 4A, for the purpose of comparison, the detected voltage of the related art of FIG. 2B is indicated by a one dot chain line. When compared to the detected voltage of the related art as indicated by the one dot chain line in FIG. 4A, the value of the detected voltage of this embodiment is higher at any time point and has more favorable followability to a change in synthesized voltage as the output thereby generating a minor error. Further, in this embodiment, a waveform of detected voltages generated when a ground capacitance Cx is relatively large more readily becomes closer to a waveform of detected voltages generated when the ground capacitance Cx is relatively small. Hence, in this embodiment, even if the detection period is shortened, a detection error can be more effectively minimized.

Now, a situation in which the ground fault resistance Rx is relatively small is herein below described with reference to FIG. 4B. As indicated by the solid line in FIG. 4B, when both of the ground fault resistance Rx and the ground capacitance Cx are relatively small, a value of the detected voltage sharply increases in accordance with a synthesized voltage when a value of the synthesized voltage is V1+V2. Subsequently, when the value of the synthesized voltage becomes V2, the detected voltage sharply decreases in accordance with the synthesized voltage. At this moment, the detected voltage changes to the value V21 lower than the synthesized voltage V2. The detected voltage subsequently gradually increases and finally becomes the value V22. Each of these detected voltages V21 and V22 is far lower than the synthesized voltage V2 and lower than the threshold Vh.

Specifically, the detected voltage sharply increases up to the value V20 in accordance with a change in synthesized voltage from the time point T0 at which the AC cycle starts until the time point T1. After the time point T1 (i.e., after the preparation period has elapsed), the detected voltage sharply decreases to the value V21 in accordance with a change in synthesized voltage. The detected voltage subsequently gradually increases up to the value V22 until the time point T3 at which the last half of the AC cycle starts. Because a waveform after the time point T3 at which the last half starts is substantially the same as the first half portion except for polarity, description thereof is herein below omitted.

As described heretofore, when both of the ground fault resistance Rx and the ground capacitance Cx are relatively small, the detected voltage decreases to less than the threshold Vh from the time point T1 until the time point T3 at which the last half starts. Hence, it is determined at any detection timing from the time point T1 (i.e., after the preparation period has elapsed) until the time point T3 at which the last half starts that the ground fault resistance Rx is relatively small, and accordingly, an electrical leakage occurs.

By contrast, as indicated by the broken line in FIG. 4B, when the ground fault resistance Rx is relatively small and the ground capacitance Cx is relatively large, a voltage detected at the connection point (M2) also changes to almost follow a changing synthesized voltage slightly behind the synthesized voltage.

Specifically, a value of the detected voltage rapidly increases to V30 in accordance with a change in synthesized voltage from the time point T0 at which the AC cycle starts until the time point T1. The voltage value V30 is smaller than the voltage value V20. Here, it is considered that the detected voltage decreases because the ground capacitance Cx is relatively large and needs to largely charge.

Subsequently, the detected voltage decreases in accordance with a change in synthesized voltage after the time point T1 (i.e., after the preparation period has elapsed). More specifically, the detected voltage decreases more gently when the ground capacitance Cx is relatively large than a voltage detected at the connection point (M2) decreases when the ground capacitance Cx is relatively small. It is considered that the detected voltage gently decreases due to influence of discharging of the relatively large ground capacitance Cx.

Subsequently, when the voltage detected when the ground capacitance Cx is relatively large becomes the same value as the voltage detected when the ground capacitance Cx is relatively small, the voltage detected when the ground capacitance Cx is relatively large gradually increases to the value V22 until the time point T3 at which the last half of the AC cycle starts like the voltage detected when the ground capacitance Cx is relatively small. Because a wave form at and after the time point T3 at which the last half starts is substantially the same as the first half portion thereof except for polarity, description thereof is herein below omitted.

In this way, the voltage detected when the ground capacitance Cx is relatively large tends to be higher than that detected when the ground capacitance Cx is relatively small only during a given period from the time point T1. However, because the voltage detected when the ground capacitance Cx is relatively large exponentially decreases, a tendency for the voltage to be higher than that detected when the ground capacitance Cx is relatively small immediately disappears.

Hence, the waveform obtained when the ground capacitance Cx is relatively large thereafter becomes similar to that obtained when the ground capacitance Cx is relatively small. Hence, by obtaining a voltage detected at the connection point (M2) at each of timings (the time points T2 and T5), specifically, when a given period has elapsed after elapse of the preparation period, it can be appropriately determined that the ground fault resistance Rx is relatively small, and accordingly, an electrical leakage occurs even if the ground capacitance Cx is relatively large.

With the above-described configuration, various advantages can be obtained as herein below described.

When a ground capacitance Cx is relatively large and an AC voltage is output, a temporal change in detected voltage is gentle due to influence of charging of the ground capacitance Cx. Specifically, a CR time constant becomes greater. In view this, an absolute value V1+V2 greater than an absolute value V2 output as an AC voltage at a detection timing (e.g., time points T2 and T5) is output as the AC voltage during a preparation period (e.g., a period from a time point T0 to a time point T1, a period from a time point T3 to a time point T4). Hence, the ground capacitance Cx charges quickly during the preparation periods prior to the respective detection timings.

With this, since influence of the ground capacitance Cx, and accordingly, a detection error caused by the ground capacitance Cx can be suppressed, determination accuracy can be upgraded. Further, by increasing the absolute value of the AC voltage during the preparation period, the ground capacitance Cx can quickly complete charging to more effectively eliminate the influence than a method of the related art in which a given voltage is continuously applied. Hence, since the detection timings can be set at earlier time points, a determination period can be more effectively shortened when compared to a situation in which the preparation period is not provided to increase the voltage value.

Further, when the ground capacitance Cx charges during the preparation period, but a polarity of the AC voltage changes between a time the preparation period starts and the end of the detection timing (i.e., each of the time points T2 and T5), the ground capacitance Cx ultimately discharges, thereby rendering the charging meaningless. In view of this, the polarity of the AC voltage, and accordingly, a charging state of the ground capacitance Cx are maintained to reduce a detection error generally caused by the ground capacitance Cx from when the preparation period starts until the detection timing ends.

Further, when a ground fault resistance Rx is relatively small and a ground capacitance Cx is relatively large, an absolute value of a voltage detected at the connection point (M2) sometimes increases due to discharging of the ground capacitance Cx after a preparation period has elapsed as indicated by the broken line in FIG. 4B. In view of this, the controller 53 obtains a voltage detected at the connection point (M2) when a given period has elapsed after the preparation period ends to suppress influence of discharging of the ground capacitance Cx and reduce a detection error.

Further, as described earlier, the oscillator 54 includes the first AC power supply 54a which outputs a voltage having a first rectangular wave (a first pulse signal) and a second AC power supply 54b which outputs a voltage having a second rectangular wave (a second pulse signal). The oscillator 54 outputs the first pulse signal and the second pulse signal by overlapping these signals with each other during the preparation period. subsequently, the oscillator 54 outputs only the second pulse signal after the end of the preparation period until the end of the detection timing. With this, a circuit enabled to increase the absolute value of the AC voltage output during the preparation period more than the absolute value of the AC voltage output at the detection timing can be simplified.

Figure 6:
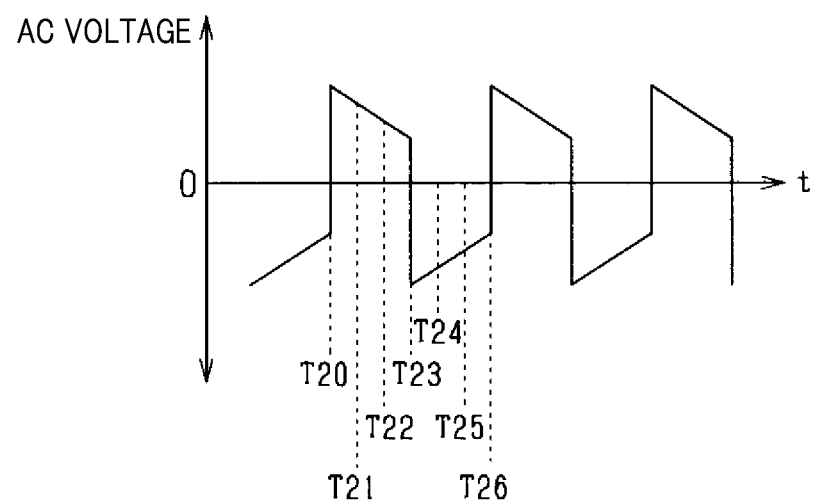
FIG. 6 is a time chart illustrating an AC voltage applied in the second embodiment of the present disclosure.
Figure 7:
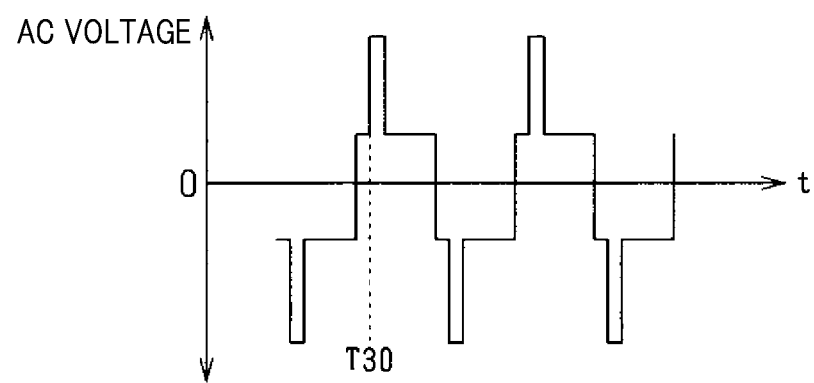
FIG. 7 is a time chart illustrating another AC voltage applied in the second embodiment of the present disclosure.

Now, an electrical leakage determination system 50 according to a second embodiment of the present disclosure is herein below described with reference to FIGS. 5 to 7.

As described earlier, the oscillator 54 of the first embodiment includes the first AC power supply 54a which outputs the first pulse signal and the second AC power supply 54b which outputs the second pulse signal. Now, such a configuration is modified in the second embodiment.

Figure 5:
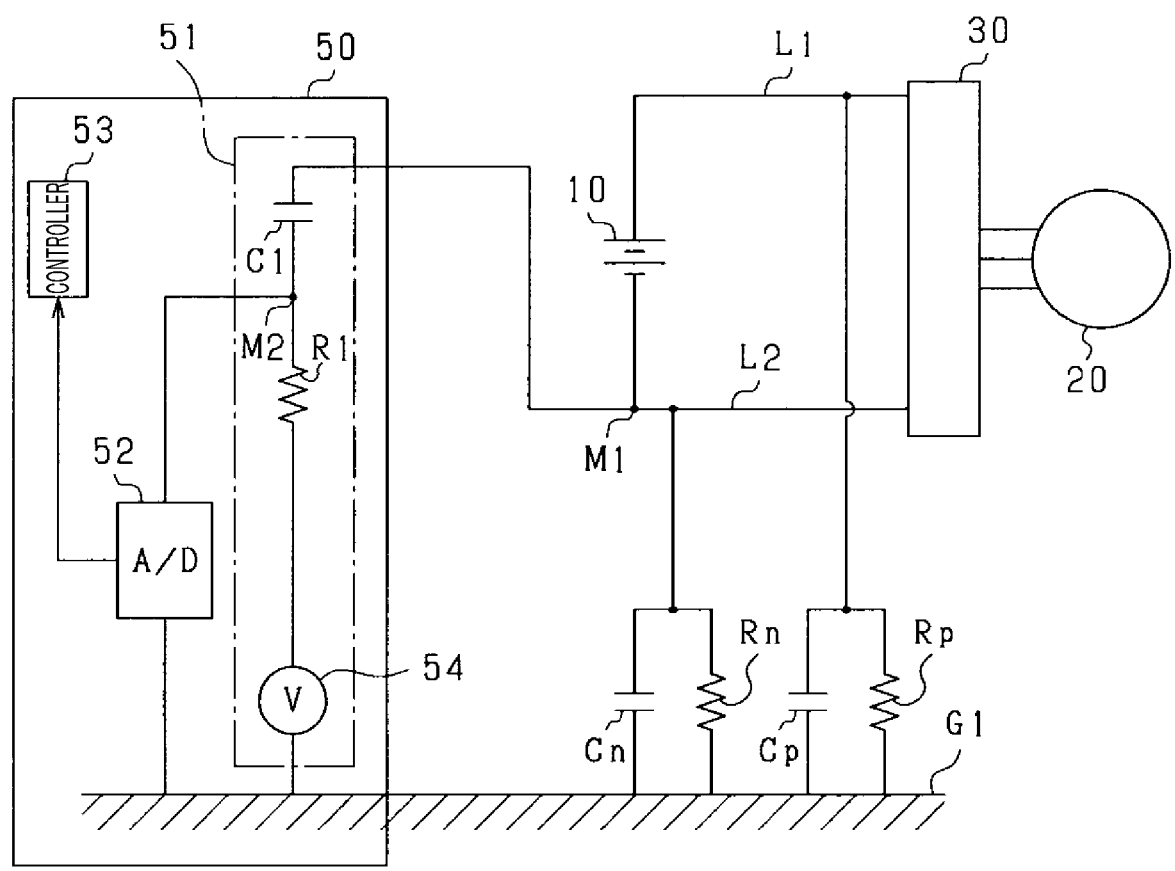
FIG. 5 is a diagram illustrating an electric circuit of an electrical leakage determination system according to a second embodiment of the present disclosure.

Specifically, as illustrated in FIG. 5, as an oscillator 54, an AC power supply enabled to arbitrarily change a waveform of an AC voltage is employed. Specifically, as illustrated in FIG. 6, the waveform output by the oscillator 54 is a saw wave in which an absolute voltage value comes to peaks at respective time points (time points T20 and T23) at which preparation periods start. After the respective time points T20 and T23 in the saw wave, the absolute voltage value gradually decreases.

Hence, by employing such a waveform as an AC voltage, the ground capacitance Cx can quickly charge during a preparation period provided prior to a detection timing (i.e., time points T22 and T25). With this, influence of the ground capacitance Cx, and accordingly, a detection error caused by the ground capacitance Cx can be suppressed thereby enabling improvement of determination accuracy. Further, by increasing the absolute value of the AC voltage during the preparation period (i.e., a period from the time point T20 to the time point T21 and period from the time point T23 to the time point T24), the ground capacitance Cx is possible to quickly complete charging thereby eliminating influence of the charging more effectively when compared to a situation in which a given voltage is continuously applied as in the related art. Hence, the detection timings (i.e., the time points T22 and T25) can be advanced to earlier time points, respectively, thereby more effectively shortening a determination period when compared to a situation in which the preparation period during which the voltage value is increased is not provided.

However, in the second embodiment, the waveform of the AC voltage output by the oscillator 54 is not limited to the saw wave and can be optionally modified to another form as long as a voltage value of it is greater during the preparation period than a voltage value at the detection timing.

Now, an electrical leakage determination system 50 according to a third embodiment of the present disclosure is herein below described with reference to FIGS. 8 to 15.

In the above-described first and second embodiments, by increasing the absolute value of the AC voltage during the preparation period and thereby allowing the ground capacitance Cx to charge, a voltage corresponding to the ground fault resistance Rx is detected at the detection timing. However, when the absolute value of the AC voltage output during the preparation period is too low and is insufficient for the ground capacitance Cx to charge during the preparation period, as similar to the related art of FIG. 4A, the ground capacitance Cx can continuously charge even after the end of the preparation period. As a result, a voltage detected at the connection point (M2) is likely to decrease due to influence of the continuous charging resulting in erroneously determination that an electrical leakage occurs.

By contrast, when the AC voltage output during the preparation period is too high, and accordingly, the ground capacitance Cx excessively charges, an absolute value of a voltage detected at the connection point (M2) can be higher due to discharging of the ground capacitance Cx even after the end of the preparation period as described with reference to FIG. 4B. Hence, in such a situation, the detected voltage does not correspond to the ground fault resistance Rx thereby causing erroneously determination that an electrical leakage is absent.

Here, in the above-described either case, when a detection timing is delayed, a voltage detected at the connection point (M2) becomes an appropriate value and determination accuracy is thereby improved as time passes. However, another problem arises in that a determination period is elongated.

Accordingly, it is necessary to appropriately set an AC voltage for the ground capacitance Cx during the preparation period. Hence, in the third embodiment, a value of the AC voltage output during a preparation period is enabled to vary as described herein below in detail.

Figure 8:
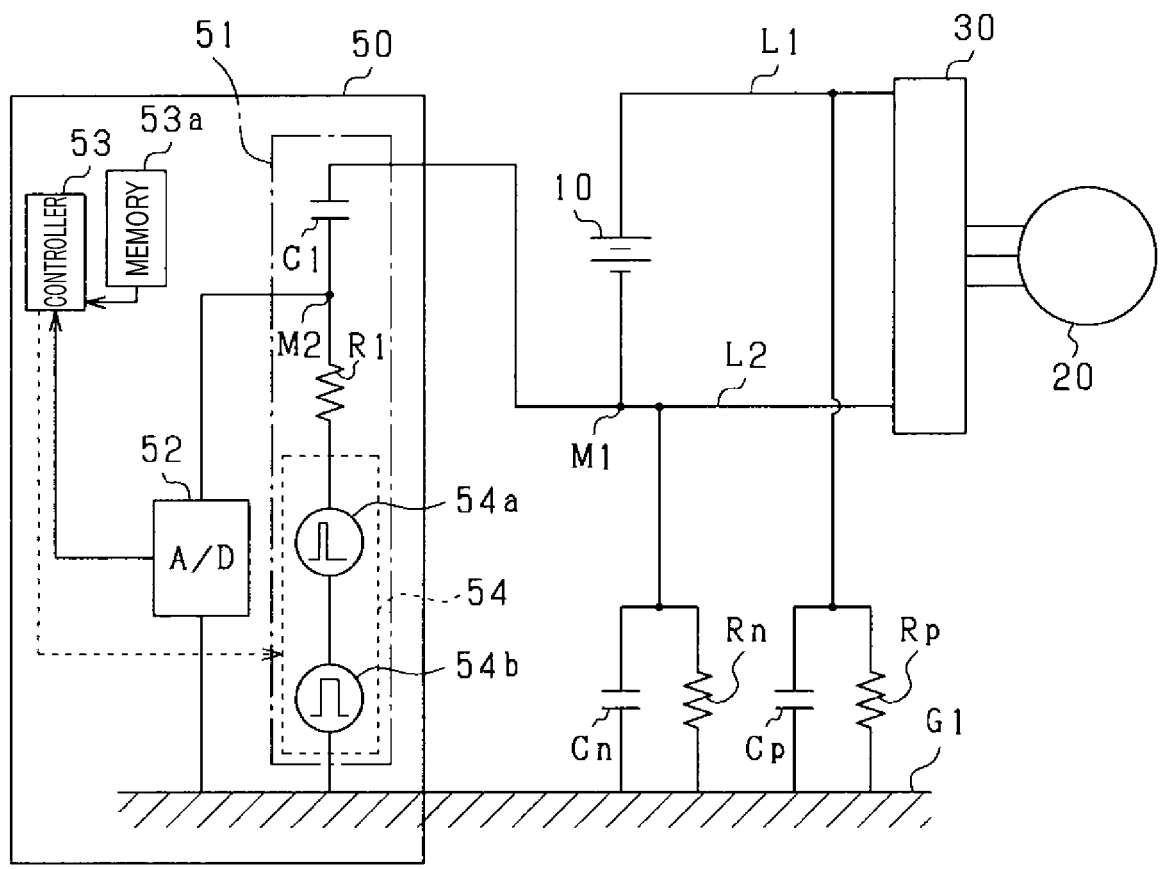
FIG. 8 is a diagram illustrating an electric circuit of an electrical leakage determination system according to a third embodiment of the present disclosure.
Figure 9:
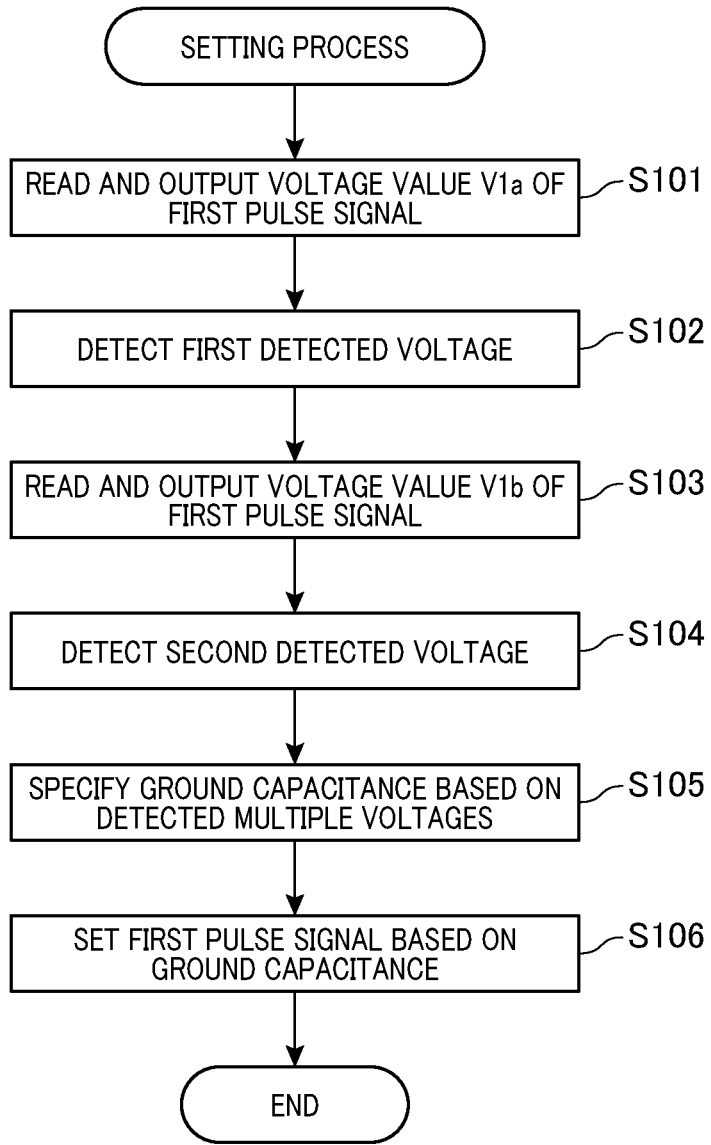
FIG. 9 is a flowchart illustrating a setting process executed in the third embodiment.

Specifically, as illustrated in FIG. 8, in an electrical leakage determination system 50 according to the third embodiment, a first AC power supply 54a is configured to be able to change a voltage value V1 (an absolute value) of a first pulse signal during a preparation period. Herein below, a period from the time point T0 at which the AC cycle starts until the time point T1 and a period from the time point T3 at which the last half of the AC cycle starts until the time point T4 (i.e., a period when the first pulse signal is output) is simply referred to as a preparation period sometimes.

The first AC power supply 54a is connected to the controller 53. Hence, the first pulse signal is set to the first AC power supply 54a and is changed by an instruction from the controller 53. With this, the controller 53 can set or change a voltage value as an AC voltage (V1+V2) during the preparation period provided prior to a detection timing. Hence, the controller 53 may correspond to a setter.

As described earlier, to appropriately set the AC voltage during the preparation period, an electric capacity of a ground capacitance Cx needs to be specified. Hence, in the third embodiment, the electric capacity of the ground capacitance Cx is firstly specified and a value of the AC voltage (i.e., the first pulse signal) is set by the controller 53 based on the specification result as described herein below with reference to FIG. 9.

First, the controller 53 reads a first voltage value V1a acting as a voltage value V1 of the first pulse signal from a memory 53a such as a RAM, etc., installed in the controller 53 (in step S101). Here, the first voltage value V1a is an optional voltage.

Subsequently, the controller 53 provides the first voltage value V1a to the oscillator 54 to cause the first AC power supply 54a of the oscillator 54 to output a first pulse signal constituting the first voltage value V1a during the preparation period. Hence, a first AC voltage is output from the oscillator 54 to provide a first absolute value (V1a+V2) during the preparation period and (a second absolute value) V2 after the end of the preparation period.

After the first AC voltage is output, the controller 53 detects a voltage (a detection target) at the connection point M2 via the A/D converter 52 at a detection timing (for example, the time point T2 or T5) when a given period has elapsed after a time point at which the preparation period ends (i.e., the time point T1 or T4) (in step S102). The voltage detected when the first AC voltage is output is herein below referred to as a first detected voltage. The controller 53 subsequently stores the first detected voltage in the memory 53a in association with the first AC voltage.

Subsequently, the controller 53 reads a second voltage value V1b serving as the voltage value V1 of the first pulse signal from the memory 53a installed in the controller 53 (in step S103). This second voltage value V1b is an optional value different from the first voltage value V1a.

Subsequently, the controller 53 provides the first voltage value V1b to the oscillator 54 to cause the first AC power supply 54a of the oscillator 54 to output a first pulse signal constituting the first voltage value V1b during the preparation period. Hence, a second AC voltage is output from the oscillator 54 to provide a first absolute value (V1b+V2) during the preparation period and (a second absolute value) V2 after the end of the preparation period.

After the second AC voltage is output, the controller 53 detects a voltage (a detection target) at the connection point M2 (via the A/D converter 52) at a detection timing (for example, the time point T2 or T5) when a given period has elapsed after a time point at which the preparation period ends (i.e., the time point T1 or T4) (in step S104). The voltage detected when the second AC voltage is output is herein below referred to as a second detected voltage. The controller 53 subsequently stores the second detected voltage in the memory 53a in association with the second AC voltage.

The controller 53 subsequently reads the first detected voltage and the second detected voltage from the memory 53a and specifies an electric capacity Cg of the ground capacitance Cx based on these detected voltages (in step S105).

Here, a method of specifying an electric capacity Cg of a ground capacitance Cx based on multiple detected voltages is herein below described in detail. In an in-vehicle motor control system, an oscillator 54, a resistor R1, a ground capacitance Cx and a ground fault resistance Rx can be represented by an equivalent circuit illustrated in FIG. 10. Because an electric capacity of it is sufficiently larger than an electric capacity Cg of the ground capacitance Cx, a coupling capacitor C1 is omitted from the equivalent circuit.

Figure 10:
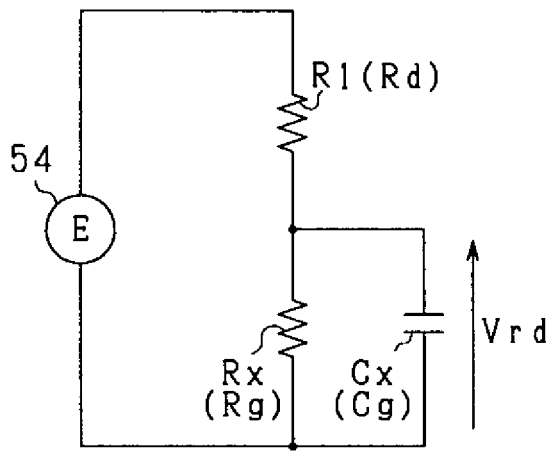
FIG. 10 is a diagram illustrating an equivalent circuit equivalent to an electric circuit of an in-vehicle motor control system employed in the third embodiment.
Figure 11A:
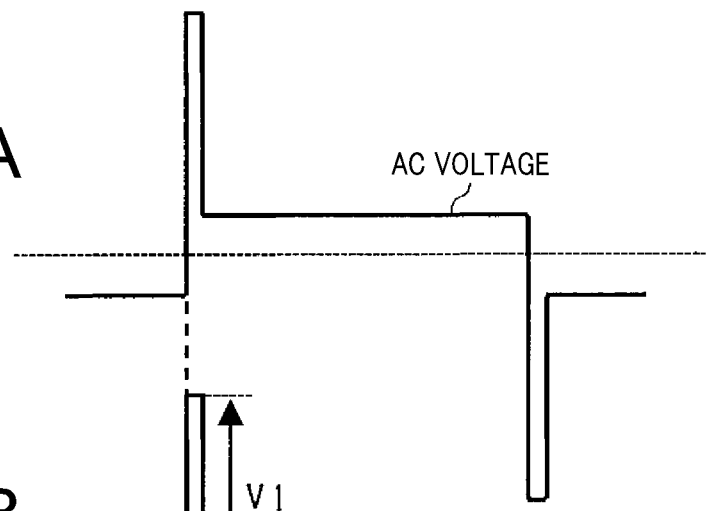
FIGS. 11A to 11E are time charts respectively illustrating pulse signals and detected voltages generated based on the pulse signals according to the third embodiment.
Figure 11B:
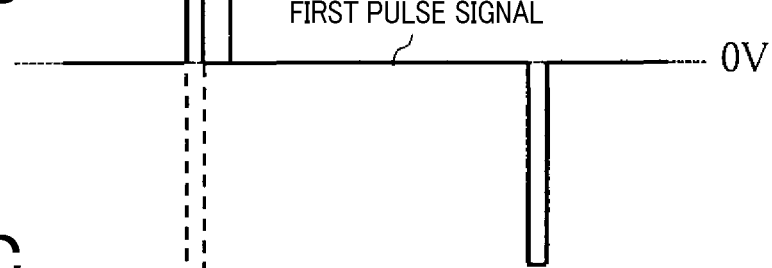
Figure 11C:
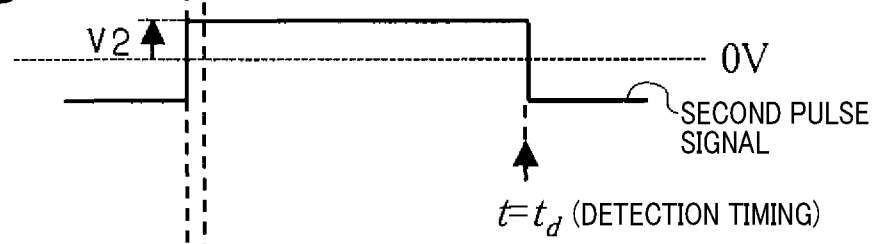

First, a change in detected voltage when an AC voltage illustrated in FIG. 11A is output from the oscillator 54 in the equivalent circuit of FIG. 10 is herein below described. The AC voltage of FIG. 11A is a synthesized voltage obtained by synthesizing a first pulse signal illustrated in FIG. 11B and a second pulse signal illustrated in FIG. 11C. Hence, a voltage detected at the connection point (M2) is equal to the sum of a voltage detected when the first pulse signal is output to the equivalent circuit and another voltage detected when the second pulse signal is output to the equivalent circuit. Hence, a situation in which the first pulse signal is output to the equivalent circuit and a voltage is detected and another situation in which the second pulse signal is output to the equivalent circuit and a voltage is detected are separately considered and described herein below.

Figure 11D:
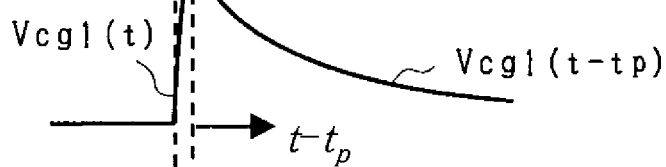

That is, when only the first pulse signal is output, a voltage Vcg1(t) detected at the connection point M2 based on the first pulse signal increases during the preparation period as calculated by a fourth equation and illustrated in FIG. 11D. In the fourth equation, V1 represents a voltage value of the first pulse signal output during the preparation period. Rd represents a resistance value of a resistor R1, and Rg represents a value of a ground fault resistance Rx. Still further, Cg represents an electric capacity of a ground capacitance Cx and t represents an elapsed period after an AC cycle starts.

$$Vcg1(t) = \frac{V1}{1 + Rd/Rg}\left[1 - \exp\left(-\frac{1 + Rd/Rd}{Cg \times Rd} \times t\right)\right] \qquad (4)$$

Subsequently, a voltage Vcg1(*t-tp*) detected at the connection point M2 based on the first pulse signal after the end of the preparation period (i.e., after the voltage value of the first pulse signal becomes zero) decreases as calculated by a fifth equation and illustrated in FIG. 11D. In the fifth equation, tp represents an elapsed period after the AC cycle starts until the preparation period ends.

$$Vcg1(t-tp) = Vcg1(t) \times \exp\left(-\frac{1+Rd/Rd}{Cg \times Rd} \times (t-tp)\right). \quad (5)$$

Figure 11E:
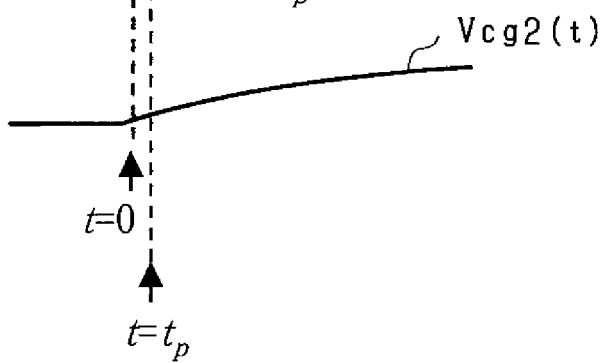

By contrast, when only the second pulse signal is output, a voltage Vcg2(*t*) detected at the connection point M2 based on the second pulse signal increases as calculated by a sixth equation and illustrated in FIG. 11E, wherein V2 represents a voltage value of the second pulse signal.

$$Vcg2(t) = \frac{V2}{1+Rd/Rg}\left[1-\exp\left(-\frac{1+Rd/Rd}{Cg \times Rd} \times t\right)\right] \quad (6)$$

As described earlier, the detected voltage Vrd(td) is equal to the sum of the voltage detected when the first pulse signal is output to the equivalent circuit and the voltage detected when the second pulse signal is output to the equivalent circuit. Hence, the detected voltage Vrd(td) is calculated by below described first to third equations, wherein td represents an elapsed period after the AC cycle starts until the detection timing.

$$Vrd(td) = Vcg1(td-tp) + Vcg2(td) \quad (1)$$

$$Vrcg1(td-tp) = \left(\frac{V1}{1+Rd/Rg}\left[1-\exp\left(-\frac{1+Rd/Rd}{Cg \times Rd} \times tp\right)\right]\right) \times \quad (2)$$
$$\exp\left(-\frac{1+Rd/Rg}{Cg \times Rd} \times (td-tp)\right)$$

$$Vrcg2(td) = \frac{V2}{1+Rd/Rg}\left[1-\exp\left(-\frac{1+Rd/Rd}{Cg \times Rd} \times td\right)\right] \quad (3)$$

In the first to third equations, two values of an electric capacity Cg of the ground capacitance Cx and a resistance value Rg of the ground fault resistance Rx are unknown. By contrast, a resistance value Rd of the resistor R1, an elapsed period tp after the AC cycle starts until the preparation period ends and an elapsed period td after the AC cycle starts until the detection timing are known. Also, a voltage value V1 of the first pulse signal and a voltage value V2 of the second pulse signal are known as well. Further, a voltage Vrd(td) can be detected. Hence, the electric capacity Cg and the resistance value Rg can be specified by establishing and solving two equations each including unknown two items of an electric capacity Cg and a resistance value Rg and varying each of known two items among Rd, tp, td, V1, V2 and Vrd (td).

Specifically, in the third embodiment, a voltage value V1 of the first pulse signal is varied and different detected voltages Vrd(td) are obtained. That is, two or more combinations of the detected voltage Vrd(td) and the voltage value V1 of the first pulse signal output when the voltage Vrd(td) is detected are obtained. Subsequently, these combinations of the detected voltage Vrd(td) and the voltage value V1 are substituted in the first to third equations and the equations are solved. Hence, the two values of the electric capacity Cg of the ground capacitance Cx and the resistance value Rg of the ground fault resistance Rx can be calculated.

Further, although the electric capacity Cg and the resistance value Rg can be calculated, a calculation amount is likely to increase. Hence, according to the third embodiment, the electric capacity Cg of the ground capacitance Cx is specified by using the below dd method.

Figure 12A:
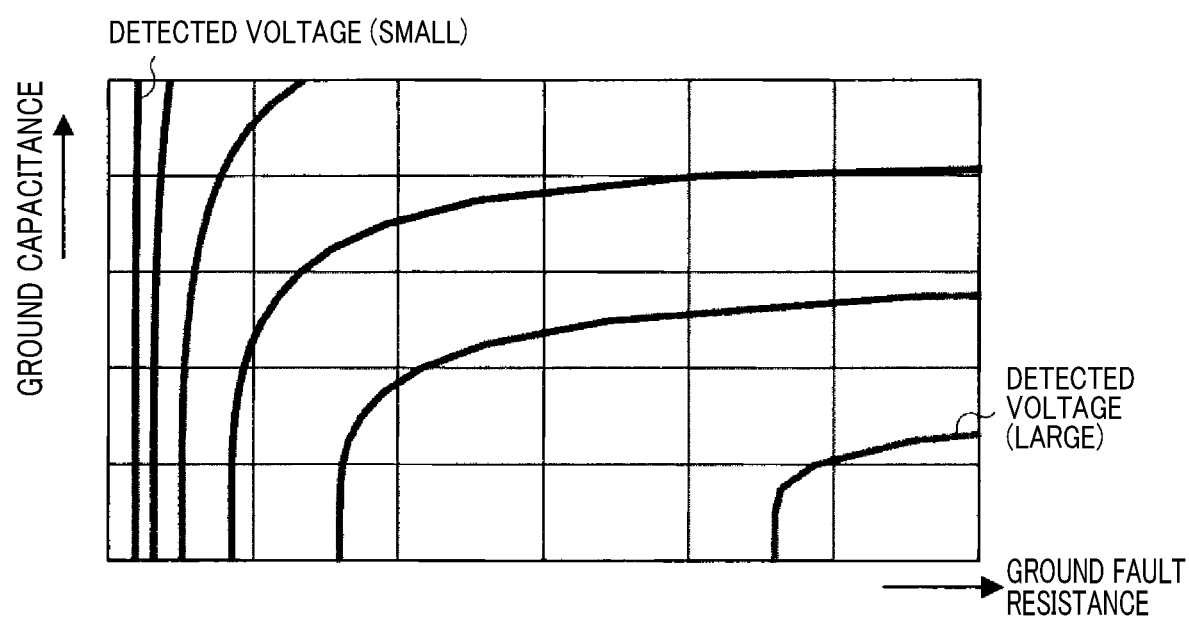
FIGS. 12A and 12B are graphs respectively illustrating first and second Cg-Rg curves used in the third embodiment.

Specifically, the controller 53 obtains a first Cg-Rg curve (i.e., a first ground capacitance-ground fault resistance curve) illustrated in FIG. 12A by substituting both of the voltage value V1*a* of the first pulse signal constituting the first AC voltage and the first detected voltage in each of the above-described first to third equations. As shown in FIG. 12A, the first Cg-Rg curve varies in accordance with a difference in detected voltage and shifts to a left side of the drawing as the detected voltage decreases.

Figure 12B:
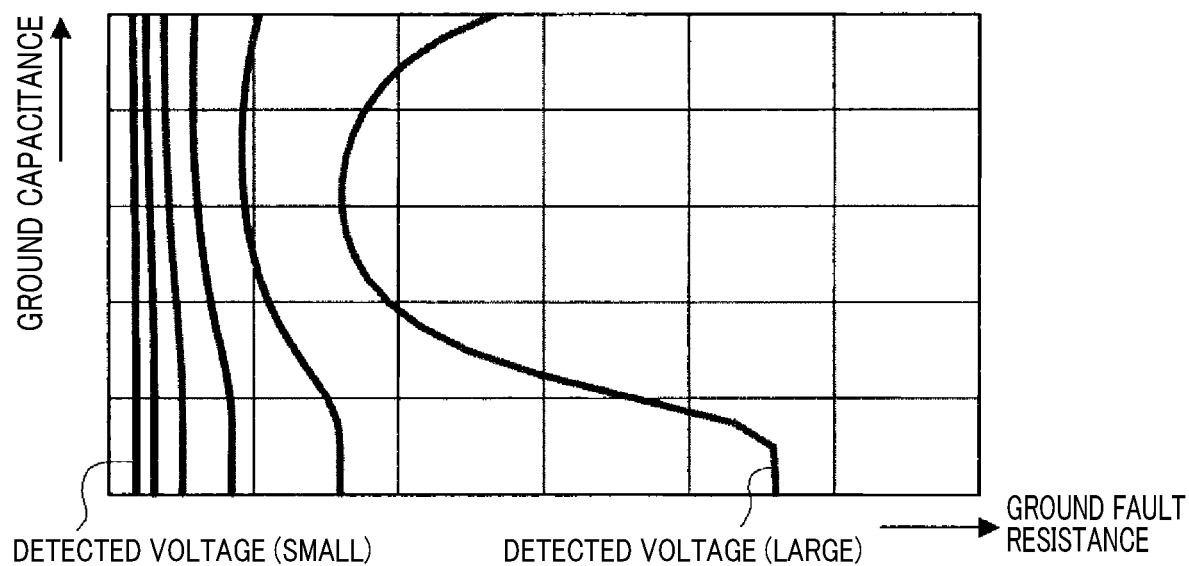

The controller 53 subsequently obtains a second Cg-Rg curve (i.e., a second ground capacitance-ground fault resistance curve) illustrated in FIG. 12B by substituting both of the voltage value V1*b* of the first pulse signal constituting the second AC voltage and the second detected voltage in the above-described first to third equations, wherein the voltage value V1*b* is greater than the voltage value V1*a*. As shown in FIG. 12B, the second Cg-Rg curve varies in accordance with a difference in detected voltage and shifts to a left side in the drawing as the detected voltage decreases.

The controller 53 subsequently specifies the electric capacity Cg of the ground capacitance Cx based on an intersection point of the first and the second Cg-Rg curves.

Figure 13A:
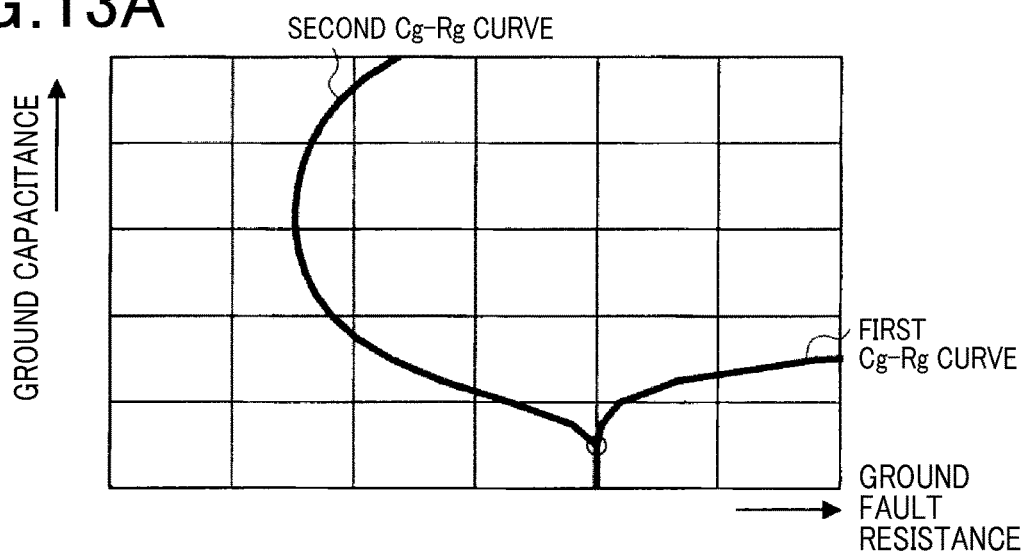
FIGS. 13A to 13C are graphs respectively illustrating intersection points of the first and second Cg-Rg curves when a ground fault resistance is relatively large.
Figure 13B:
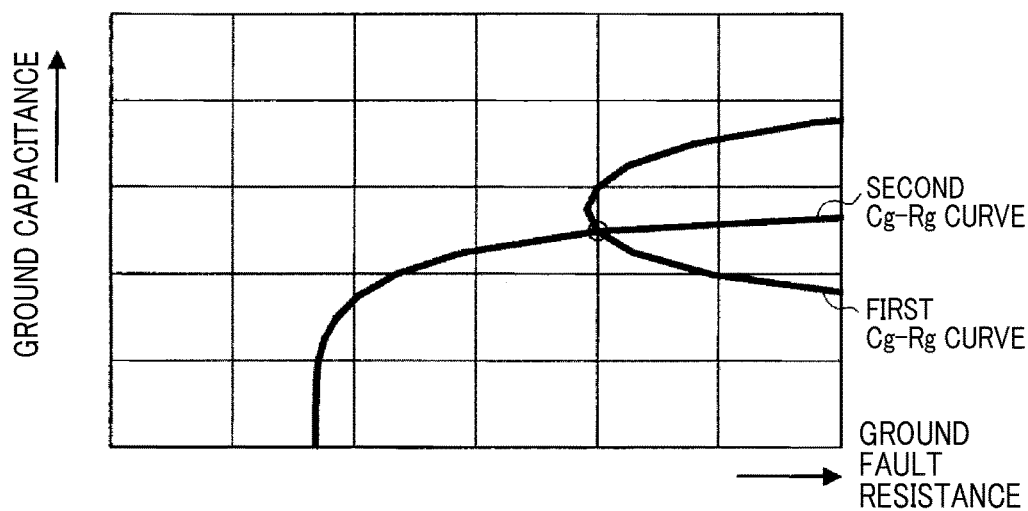
Figure 13C:
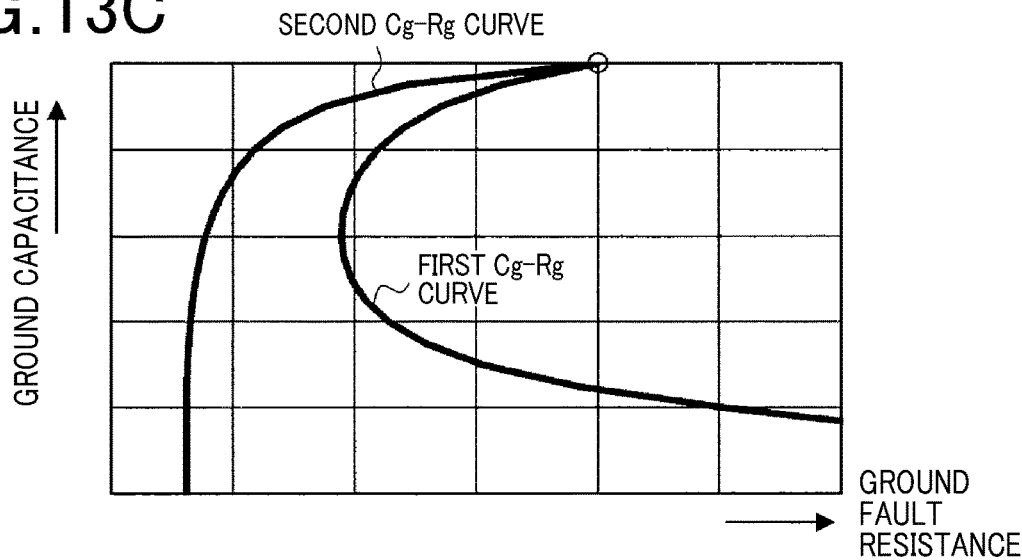

For example, FIG. 13A to 13C illustrate examples of the intersection point of the first and the second Cg-Rg curves when a ground fault resistance is relatively large. As shown, when the electric capacity Cg is relatively small, the first Cg-Rg curve intersects with the second Cg-Rg curve at a point illustrated in FIG. 13A. When the electric capacity Cg is medium, the first Cg-Rg curve intersects with the second Cg-Rg curve at a point illustrated in FIG. 13B. Further, when the electric capacity Cg is relatively large, the first Cg-Rg curve intersects with the second Cg-Rg curve at a point illustrated in FIG. 13C.

Figure 14A:
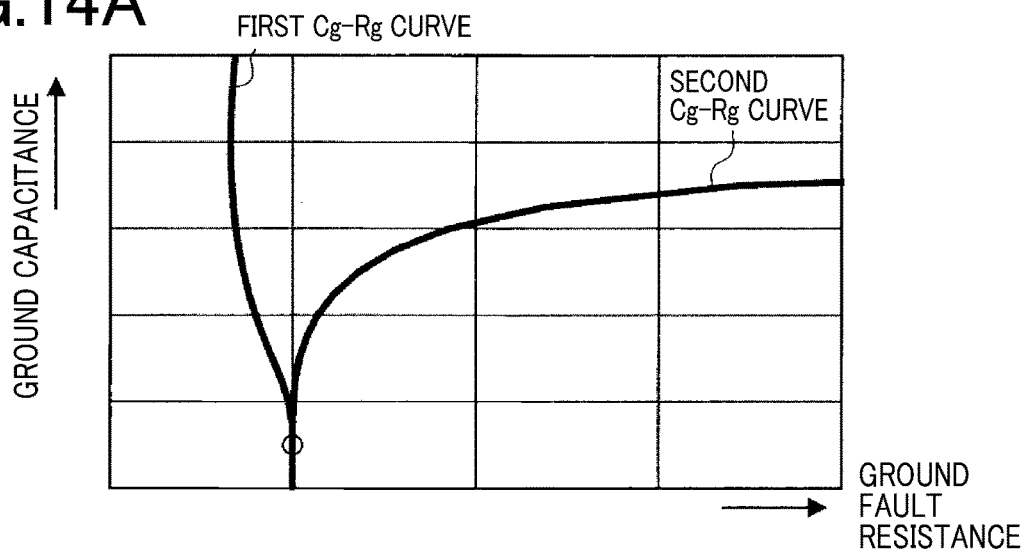
FIGS. 14A to 14C are graphs respectively illustrating intersection points of the first and second Cg-Rg curves when a ground fault resistance is medium.
Figure 14B:
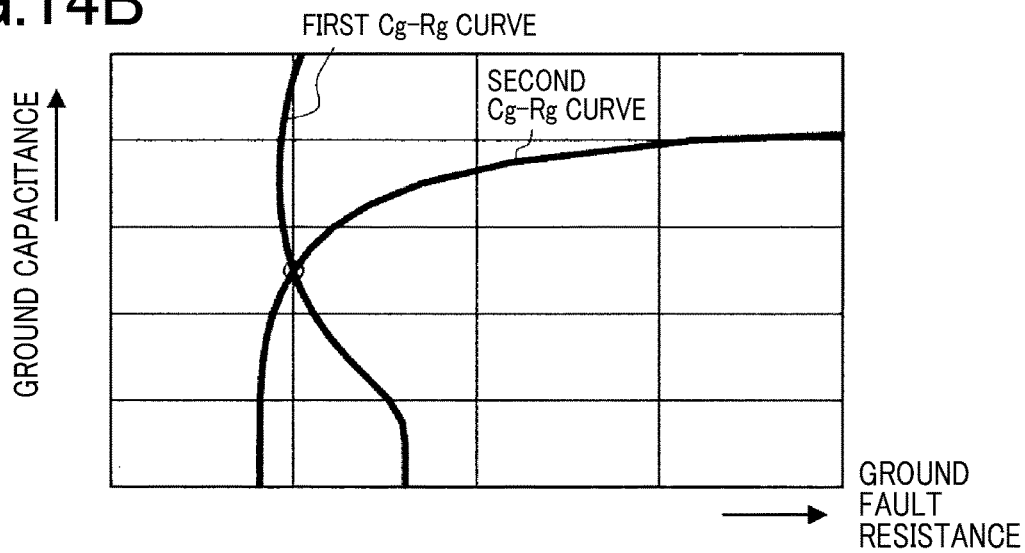
Figure 14C:
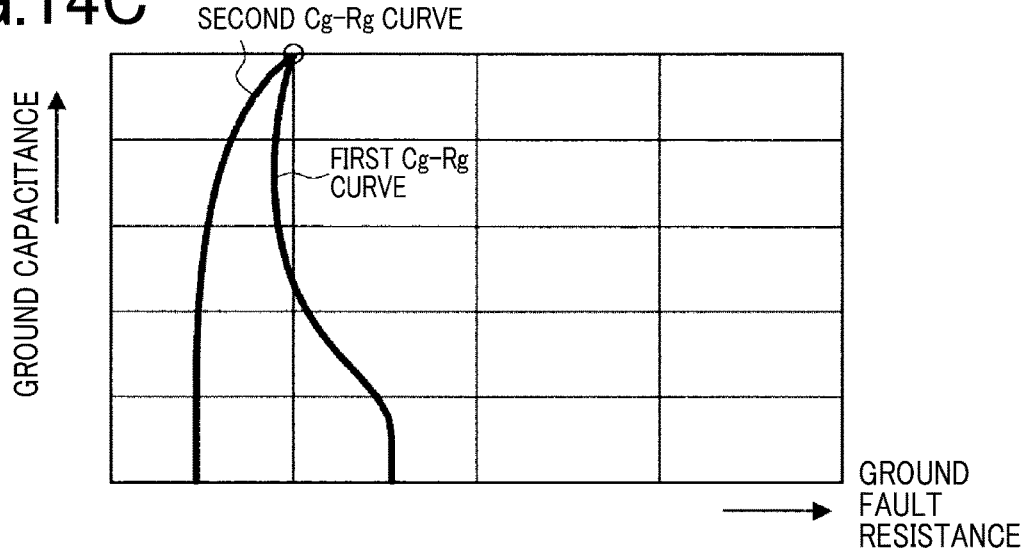

FIGS. 14A to 14C Similarly illustrate examples of an intersection point of the first Cg-Rg curve and the second Cg-Rg curve when the ground fault resistance is medium. As shown, when the electric capacity Cg is relatively small, the first Cg-Rg curve intersects with the second Cg-Rg curve at a point illustrated in FIG. 14A. When the electric capacity Cg is medium, the first Cg-Rg curve intersects with the second Cg-Rg curve at a point illustrated in FIG. 14B. Further, when the electric capacity Cg is relatively large, the first Cg-Rg curve intersects with the second Cg-Rg curve at a point illustrated in FIG. 14C.

Figure 15A:
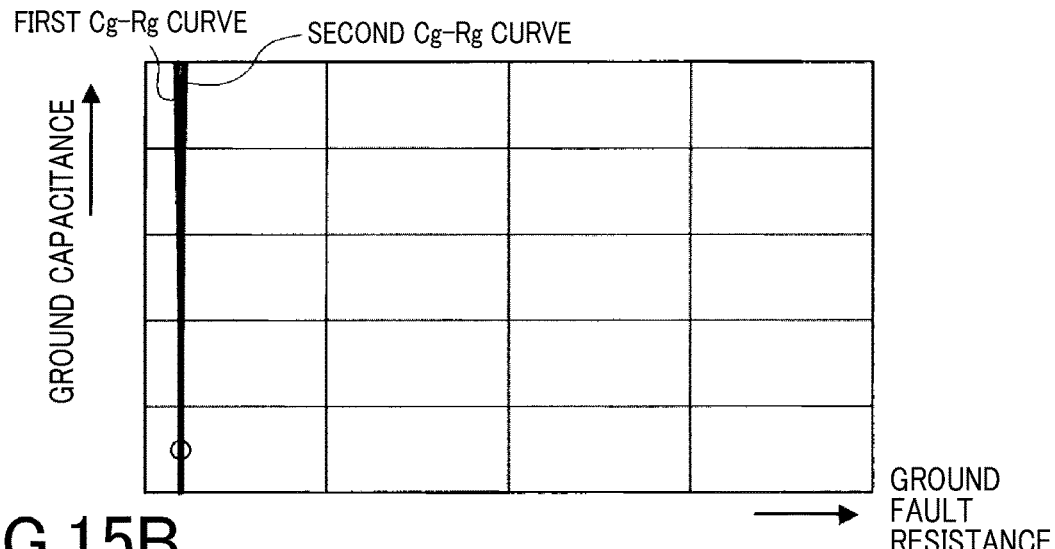
FIGS. 15A to 15C are graphs respectively illustrating intersection points of the first and second Cg-Rg curves when a ground fault resistance is relatively small.
Figure 15B:
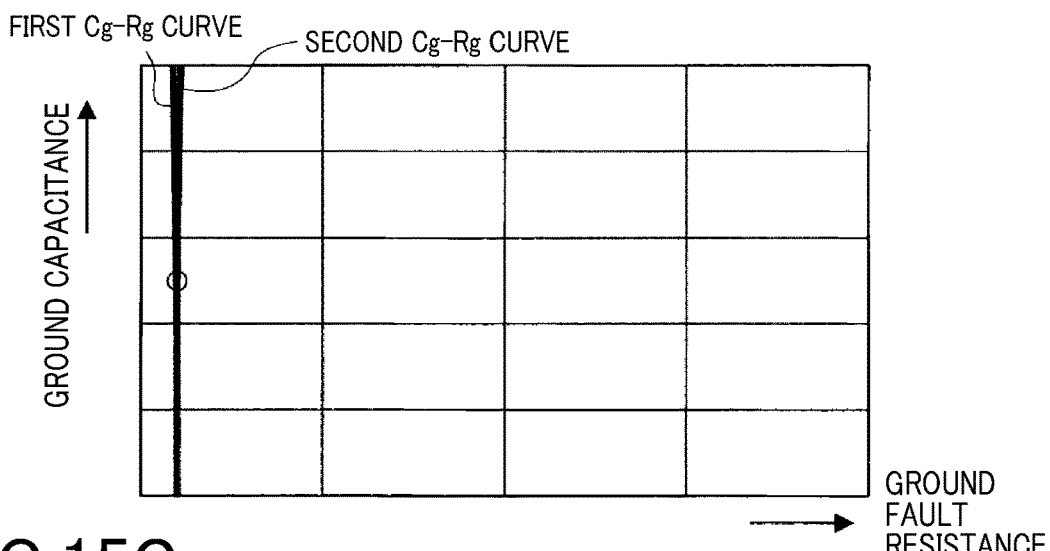
Figure 15C:
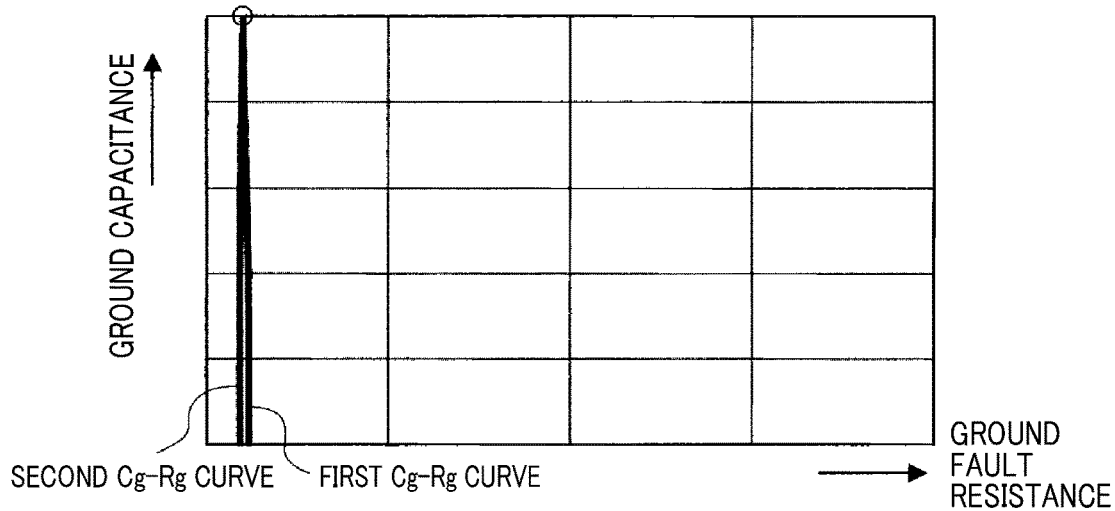

FIGS. 15A to 15C similarly illustrate examples of an intersection point of the first Cg-Rg curve and the second Cg-Rg curve when the ground fault resistance is relatively small. As shown, when the electric capacity Cg is relatively small, the first Cg-Rg curve intersects with the second Cg-Rg curve at a point illustrated in FIG. 15A. When the electric capacity Cg is medium, the first Cg-Rg curve intersects with the second Cg-Rg curve at a point illustrated in FIG. 15B. Further, when the electric capacity Cg is relatively large, the first Cg-Rg curve intersects with the second Cg-Rg curve at a point illustrated in FIG. 15C.

As described heretofore, the controller 53 is enabled to specify the electric capacity Cg of the ground capacitance Cx from the intersection point of the first and the second Cg-Rg curves.

The controller 53 subsequently specifies the voltage value V1 of the first pulse signal in accordance with the electric capacity Cg of the ground capacitance Cx (in step S105). Specifically, a voltage value V1 of the first pulse signal is adjusted and set as an AC voltage (i.e., a synthesized voltage) to allow the ground capacitance Cx to charge an equivalent amount to the electric capacity Cg during the preparation period. For example, the voltage value V1 of the first pulse signal corresponding to the electric capacity Cg can be obtained by seeking an appropriate first pulse signal corresponding to the electric capacity Cg through an experiment and storing an experimental result in a map. Subsequently, the voltage value V1 is set with reference to the map. Further, the voltage value V1 can be obtained through calculation as well.

Further, the electric capacity Cg of the ground capacitance Cx is maintained at substantially the same value per vehicle. Hence, when the electric capacity Cg of the ground capacitance Cx is calculate once, an appropriate AC voltage can be continuously applied. Further, as illustrated in FIGS. 13A to 15C, when the resistance value Rg of the ground fault resistance Rx is relatively small, resolution of the electric capacity Cg becomes poor. Hence, specification of the electric capacity Cg of the ground capacitance Cx is preferably executed when electric insulation is reliable such as a time after maintenance, etc.

As descried heretofore, the electric capacity Cg can be specified based on multiple voltages detected by varying the first pulse signal. In addition, the controller 53 is enabled to specify the electric capacity Cg of the ground capacitance Cx and set (or change) the voltage value V1 of the first pulse signal to be an appropriate value in accordance with the electric capacity Cg. With this, the ground capacitance Cx can appropriately charge during the preparation period, and accordingly determination accuracy of an electrical leakage can be improved. Further, when the electric capacity Cg of the ground capacitance Cx is specified once, since multiple detected voltages are not needed thereafter, a determination period can be shortened.

Now, an electrical leakage determination system 50 according to a fourth embodiment of the present disclosure is hereinbelow described.

As described in the third embodiment, the resistance value (Rg) of the ground fault resistance Rx and the electric capacity Cg of the ground capacitance Cx can be specified based on the multiple detected voltages. Hence, according to the fourth embodiment, the resistance value Rg of the ground fault resistance Rx is specified based on the multiple detected voltages, and it is determined if an electrical leakage occurs based on the resistance value Rg as described below in detail. However, description of a configuration similar to that in the third embodiment is herein below omitted.

Figure 16:
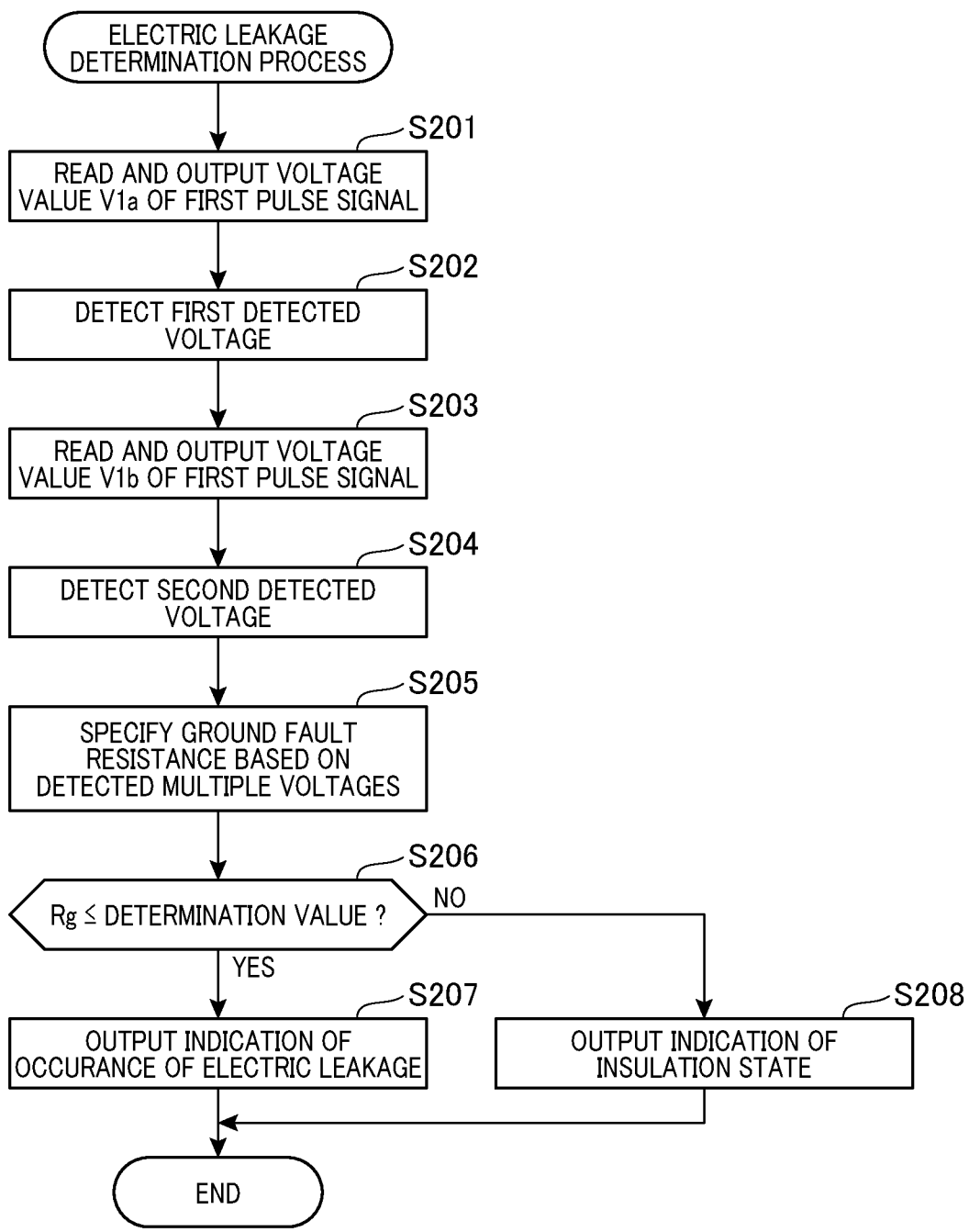
FIG. 16 is a flowchart illustrating an electrical leakage determination process executed in a fourth embodiment of the present disclosure.

Specifically, as shown in FIG. 16, an electric leak determination process performed by the controller 53 is executed either at a given timing (for example, an engine start time or the like) or in a given cycle.

Specifically, in steps S201 to S202 serving as the electrical leakage determination process, similar to steps S101 to S102 as a setting process, the controller 53 stores the first detected voltage in the memory 53a in association with the first AC voltage. In steps S203 to S204 serving as the electrical leakage determination process, similar to steps S103 to S104 as the setting process, the controller 53 stores the second detected voltage in the memory 53a in association with the second AC voltage.

Subsequently, in step S205, the controller 53 reads the first and second detected voltages from the memory 53a and specifies the resistance value Rg of the ground fault resistance Rx based on these detected voltages using substantially the same method of specifying the electric capacity Cg of the ground capacitance Cx.

Specifically, two values of the electric capacity Cg of the ground capacitance Cx and the resistance value Rg of the ground fault resistance Rx are calculated by respectively substituting the combination of the first detected voltage and the first AC voltage and the combination of the second detected voltage and the second AC voltage in the first to third equations and solving these equations.

In the fourth embodiment, similar to the third embodiment, the first Cg-Rg curve and the second Cg-Rg curve can be obtained to specify the resistance value Rg of the ground fault resistance Rx based on the intersection point thereof.

The controller 53 subsequently determines if the resistance value Rg of the ground fault resistance Rx is equal to or less than a given determination value indicating an electrical leakage (step S206). When this determination result is positive, the controller 53 determines that the electrical leakage occurs and outputs such a determination result (in step S207). By contrast, when the determination result is negative, the controller 53 determines that an insulation state is maintained (i.e., the electrical leakage does not occur) and outputs such a determination result (in step S208). Subsequently, the electrical leakage determination process is completed.

As described heretofore, according to the fourth embodiment, the controller 53 is enabled to specify the resistance value Rg of the ground fault resistance Rx based on the multiple detected voltages and determine if the electrical leakage occurs based on the resistance value Rg. With this, it is possible to highly precisely determine regardless of the ground capacitance Cx if the electrical leakage occurs.

Further, as illustrated in FIG. 15, although resolution of the electric capacity Cg of the ground capacitance Cx is poor when the resistance value Rg of the ground fault resistance Rx is relatively small, resolution of the resistance value Rg of the ground fault resistance Rx is not poor. Accordingly, it is highly precisely possible to determine if the electrical leakage occurs.

Figure 17:
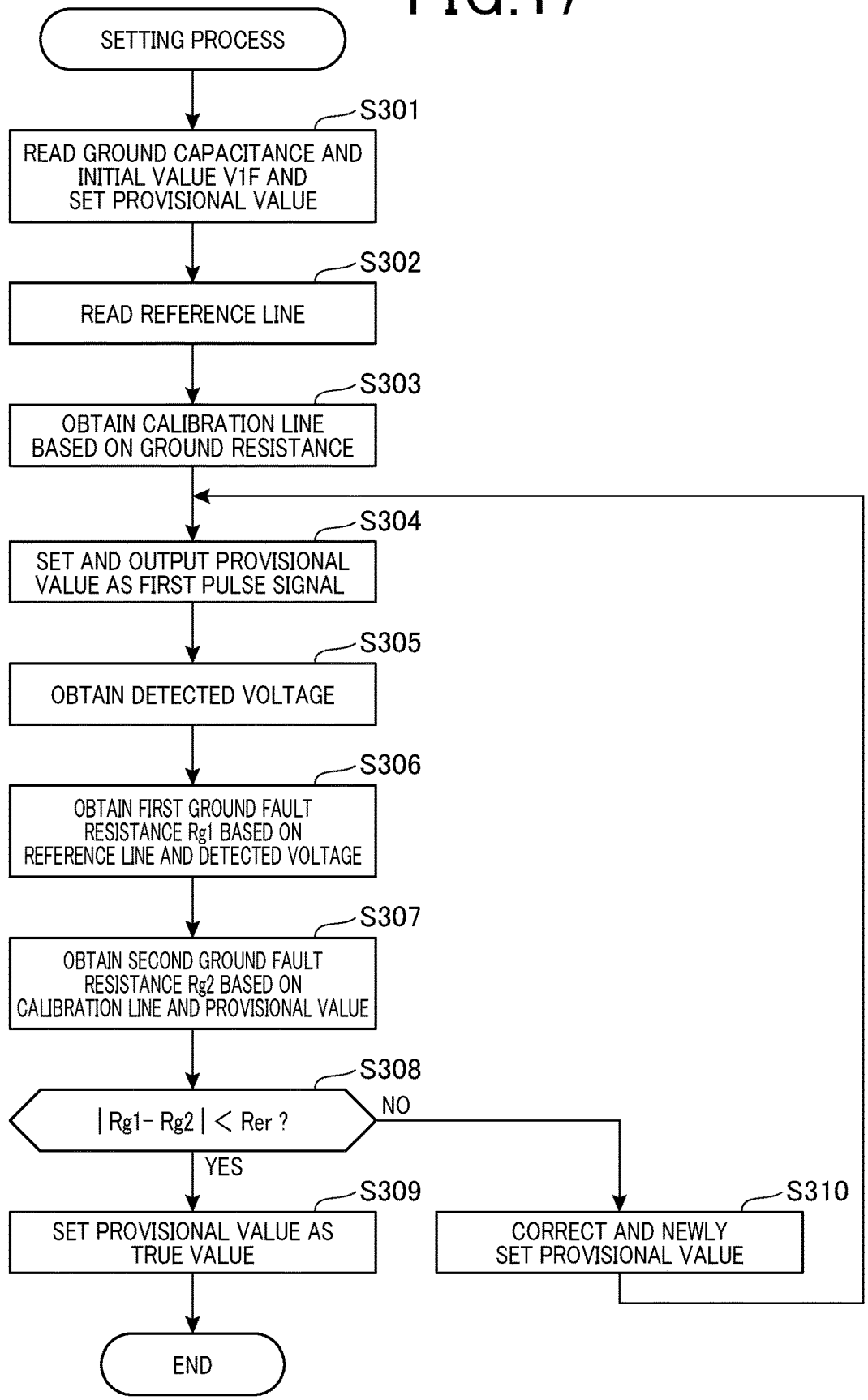
FIG. 17 is a flowchart illustrating a setting process executed in a fifth embodiment of the present disclosure.

Now, an electrical leakage determination system 50 according to a fifth embodiment is described with reference to FIGS. 17 to 19.

As described in the third embodiment, the voltage value V1 of the first pulse signal needs to be an appropriate value in accordance with the electric capacity Cg of the ground capacitance Cx. Hence, in the third embodiment, the appropriate voltage value is specified either with reference to the map determined based on the experiment or through the calculation. However, usage of such methods is time consuming. In this point of view, according to the fifth embodiment, a setting process is performed as illustrated in FIG. 17 to more easily set the voltage value V1 of the first pulse signal appropriately as described below in detail. A circuit of the electrical leakage determination system 50 of this embodiment is substantially the same as that in the third embodiment.

Specifically, the controller 53 initially reads and obtains both of an electric capacity Cg of the ground capacitance Cx and an initial value V1$f$ of the first pulse signal from the memory 53a (in step S301). Here, the initial value V1$f$ of the first pulse signal is an optional value. Hence, the controller 53 corresponds to an obtainer in the embodiment. The electric capacity Cg of the ground capacitance Cx can be either specified or measured using the method employed in the third embodiment. Because the same type vehicle has substantially the same value of the electric capacity Cg of the ground capacitance Cx, the electric capacity Cg of the ground capacitance Cx can be previously stored in association with the vehicle. After reading it, the controller 53 sets the initial value V1*f* as a provisional value of the voltage value V1 of the first pulse signal.

The controller 53 subsequently obtains a reference line indicating a relation between a voltage Vrd detected at the connection point (M2) and a resistance value Rg of the ground fault resistance Rx from the memory 53*a* (in step S302). The reference line indicates the relation therebetween when it is supposed that a voltage value of an AC current is the same from the start of the AC cycle until the detection timing and the electric capacity Cg of the ground capacitance Cx is zero. Specifically, the reference line indicates the relation therebetween when the electric capacity Cg of the ground capacitance Cx is zero and an AC voltage only including the second pulse signal while excluding the first pulse signal is output (i.e., a case of an ideal state).

Hence, when the electric capacity Cg of the ground capacitance Cx is zero thereby not necessitating charging during the preparation period and the AC voltage composed only of the second pulse signal is output, an ideal detected voltage Vrd for the resistance value Rg of the ground fault resistance Rx is output. Specifically, when the electric capacity Cg of the ground capacitance Cx is zero, resolution of the resistance value Rg of the ground fault resistance Rx becomes most favorable in relation to the detected voltage Vrd even if the first pulse signal is not output. Accordingly, a relation between the detected voltage Vrd and the resistance value Rg of the ground fault resistance Rx established when the most favorable resolution is obtained corresponds to the reference line.

Figure 18A:
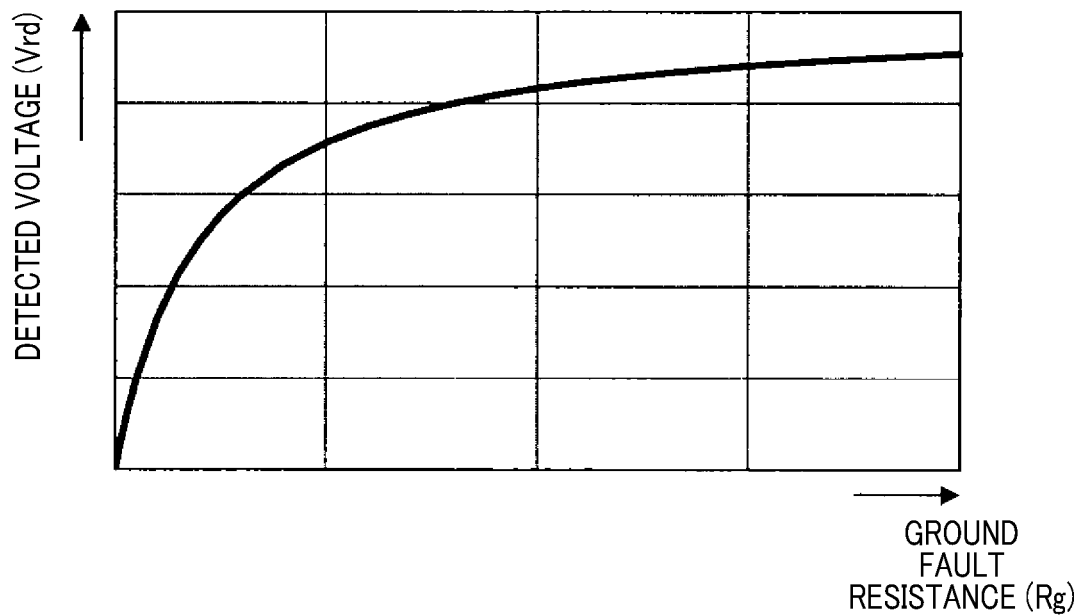
FIGS. 18A and 18B are graphs respectively illustrating a reference line and a calibration line used in the fifth embodiment.

The above-described reference line can be obtained by substituting zeros for the voltage value V1 of the first pulse signal and the electric capacity Cg of the ground capacitance Cx in each of the first to third equations, respectively, as calculated by a seventh equation and illustrated in FIG. 18A.

$$Vrd = \frac{V2}{1 + Rd/Rg} \quad (7)$$

The controller 53 subsequently obtains a calibration line indicating a relation between the voltage value V1 of the first pulse signal and the resistance value Rg of the ground fault resistance Rx from the memory 53*a* (in step S303) in accordance with the electric capacity Cg of the ground capacitance Cx obtained in step S301. The calibration line is determined to cause a relation between the detected voltage Vrd and the resistance value Rg of the ground fault resistance Rx to correspond to the reference line when the ground capacitance Cx is supposed to have the electric capacity Cg as obtained in step S301, Specifically, the calibration line indicates a voltage value V1 of the first pulse signal to be output for the resistance value Rg of the ground fault resistance Rx to maintain the relation between the detected voltage Vrd and the resistance value Rg of the ground fault resistance Rx as indicated by the reference line.

Figure 18B:
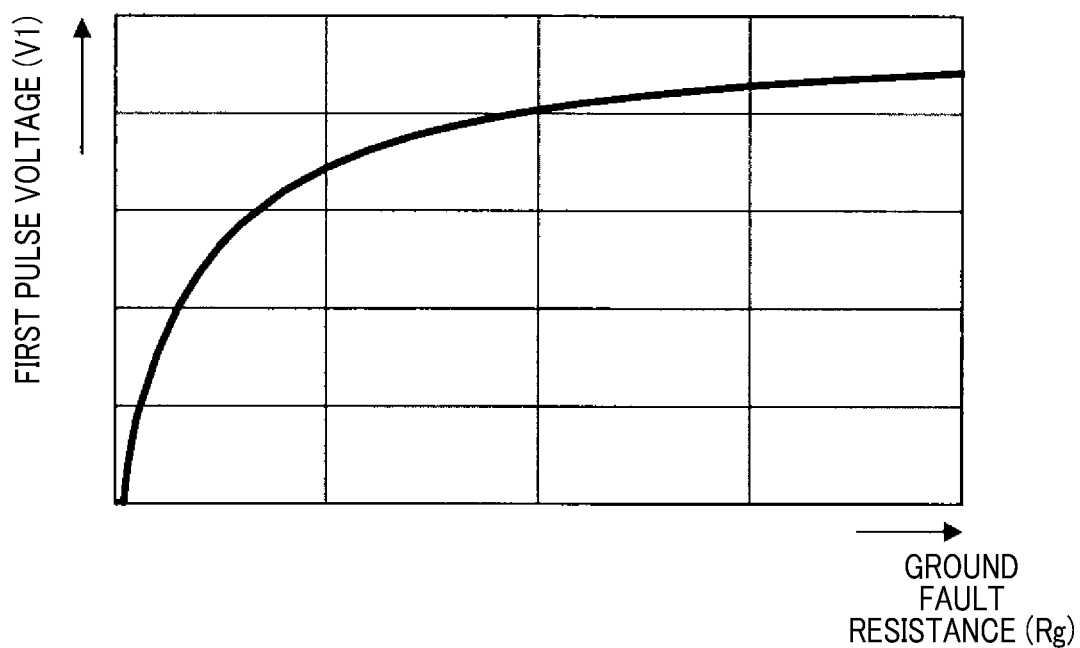

The calibration line may be obtained, for example, by solving the first to third and seventh and is illustrated in FIG. 18B. Further, the calibration line can be obtained by measuring a calibration line per electric capacity (Cg) through an experiment or the like, storing the measuring result in a memory as a map and referring to the map.

Subsequently, the controller 53 sets the provisional value as set in step S301 (or step S310 described later) as a voltage value V1 of the first pulse signal and causes the oscillator 54 to output the provisional value (in step S304). Subsequently, the controller 53 detects a voltage (i.e., a voltage detected at the connection point (M2)) via the A/D converter 52 (in step S305).

Subsequently, the controller 53 specifies a resistance value Rg of the ground fault resistance Rx (hereinafter referred to as a first ground fault resistance Rg1) corresponding to the voltage detected in step S305 with reference to the reference line (in step S306).

Further, the controller 53 specifies a resistance value Rg of the ground fault resistance Rx (hereinafter referred to as a second ground fault resistance Rg2) corresponding to the provisional value set in step S301 (or step S310) with reference to the calibration line obtained in step S303 (step S307).

The controller 53 subsequently determines if a difference between the first ground fault resistance Rg1 and the second ground fault resistance Rg2 falls within a given range, and if the difference is smaller than a given determination threshold Rer (in step S308).

When this determination result is positive, the controller 53 determines that the provisional value is appropriate as the voltage value V1 of the first pulse signal and sets the provisional value as a true value of the voltage value V1 of the first pulse signal (in step S309). Subsequently, the setting process is terminated.

By contrast, when the determination result is negative in step S308, the controller 53 corrects the provisional value of the voltage value V1 of the first pulse signal and newly sets a corrected value of the voltage value V1 (in step S310). Specifically, the controller 53 calculates an intermediate value between the first ground fault resistance Rg1 and the second ground fault resistance Rg2 and specifies a voltage value of the first pulse signal corresponding to the intermediate value with reference to the calibration line. The controller 53 subsequently sets the specified value as a new provisional value.

That is, the controller 53 may calculate an average value of the first ground fault resistance Rg1 and the second ground fault resistance Rg2 as the intermediate value and specify a voltage value of the first pulse signal corresponding to the intermediate value with reference to the calibration line. Subsequently, the controller 53 may set the specified value as a new provisional value. After that, the process proceeds to a step S304 and the process of the step S304 and subsequent steps are executed again.

Figure 19A:
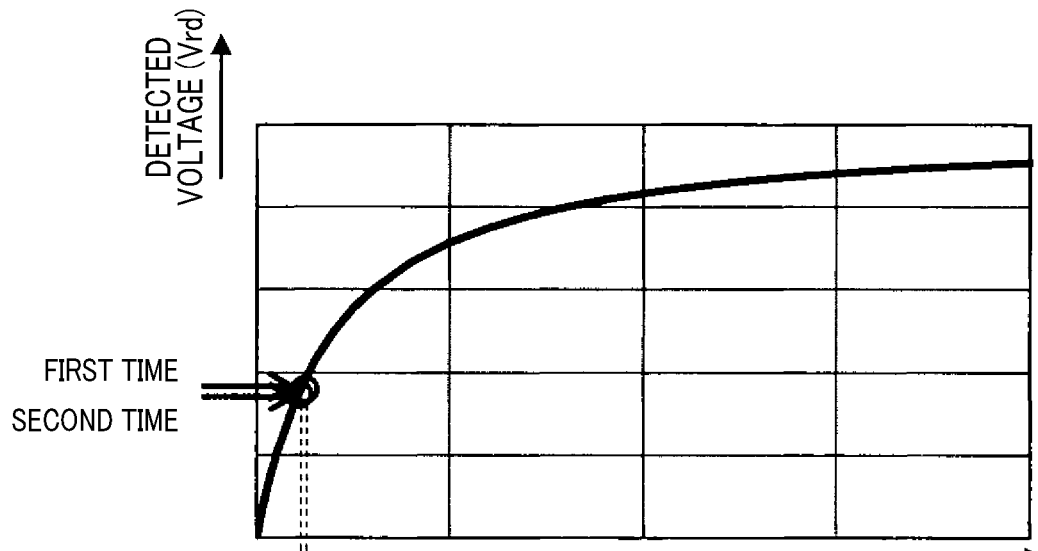
FIGS. 19A and 19B are graphs collectively illustrating an exemplary reference when a resistance value and a true value are specified in the fifth embodiment.
Figure 19B:
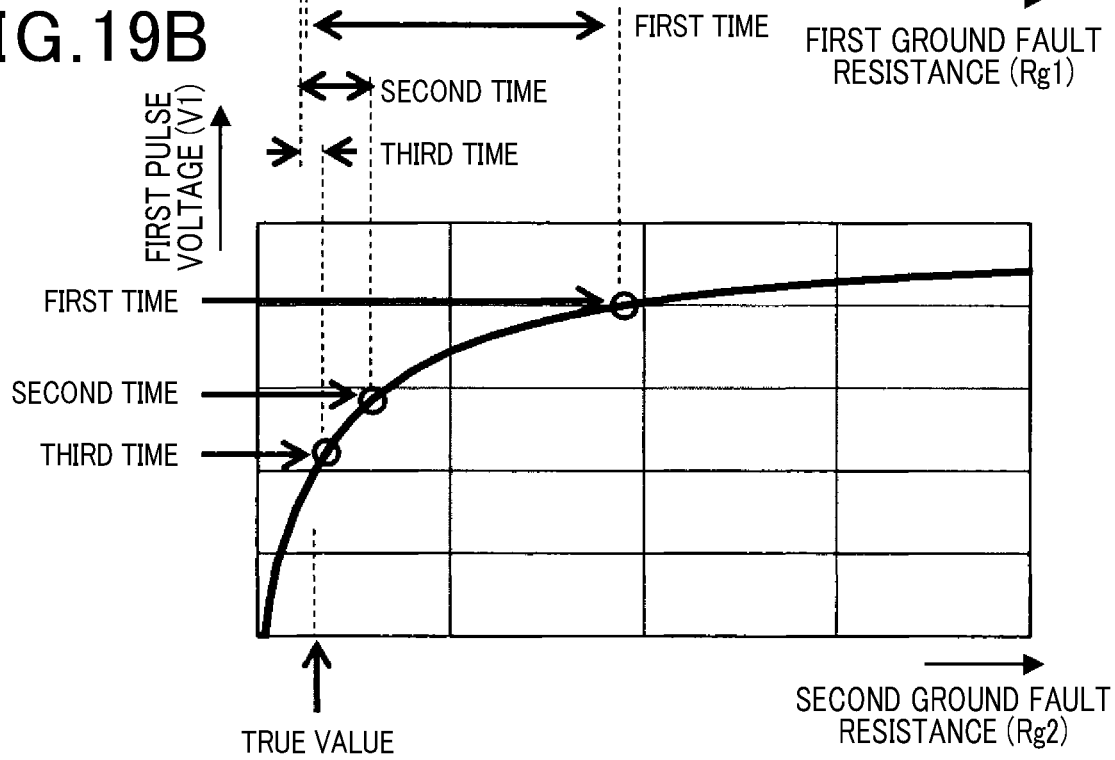

When processes of from the step S304 to the step S310 are repeated, the difference between the first ground fault resistance Rg1 and the second ground fault resistance Rg2 almost disappears as illustrated in FIG. 19, thereby enabling determination of the true value. FIG. 19 illustrates an aspect where the provisional value is set three times and the difference between the first ground fault resistance Rg1 and the second ground fault resistance Rg2 disappears, thereby determining the true value.

Hence, according to the fifth embodiment of the present disclosure, the below described advantages can be obtained.

When it is supposed that the voltage value V1 of the first pulse signal is zero and the electric capacity Cg of the ground capacitance Cx is also zero, resolution of the resistance value Rg of the ground fault resistance Rx regarding the detected voltage Vrd may be increased. As a result, the resistance value Rg of the ground fault resistance Rx can be easily detected precisely. In view of this, the true value is sought and specified by repeatedly changing the voltage value V1 of the first pulse signal until the relation approximates the reference line. The true value is set thereafter. With this, the voltage value of the first pulse signal can be changed to allow the ground capacitance Cx to charge an appropriate amount.

Further, the calibration line indicating the relation between the voltage value V1 of the first pulse signal and the resistance value Rg of the ground fault resistance Rx is predetermined to cause a relation between the detected voltage Vrd and the resistance value Rg of the ground fault resistance Rx established when the ground capacitance Cx is supposed to be equivalent to the measured value obtained in step S301 to match the reference line. Hence, the first ground fault resistance Rg1 specified with reference to the reference line based on the voltage Vrd detected when the provisional value is output from the oscillator 54 needs to match the second ground fault resistance Rg2 obtained from the calibration line corresponding to the provisional value.

Accordingly, based on a comparison between the first ground fault resistance Rg1 and the second ground fault resistance Rg2, the true value as the voltage value of the first pulse signal can be set to allow the electric capacity C to charge an appropriate amount.

Further, when a difference between the first ground fault resistance Rg1 and the second ground fault resistance Rg2 is out of a given range, the controller 53 calculates the intermediate value of the first ground fault resistance Rg1 and the second ground fault resistance Rg2, and specifies the voltage value corresponding to the intermediate value with reference to the calibration line, The controller 53 subsequently newly sets a voltage value as a new provisional value. By contrast, when the difference between the first ground fault resistance Rg1 and the second ground fault resistance Rg2 falls within the given range, the controller 53 sets the provisional value as the true value. With this, the true value can be specified by making a simple calculation while reducing the number of times the provisional value is changed.

Further, in the fifth embodiment, the true value is specified to be able to bring the relation between the detected voltage Vrd and the resistance value Rg of the ground fault resistance Rx closer to the reference line. Hence, the resistance value Rg of the ground fault resistance Rx can be specified based on the true value with reference to the calibration line. Further, the resistance value Rg of the ground fault resistance Rx can also be specified based on the voltage Vrd detected at the connection point (M2) with reference to the reference line. Furthermore, it is also possible to determine if an electrical leakage occurs based on the resistance value Rg.

Herein below Other embodiments of the present disclosure are described.

Figure 20:
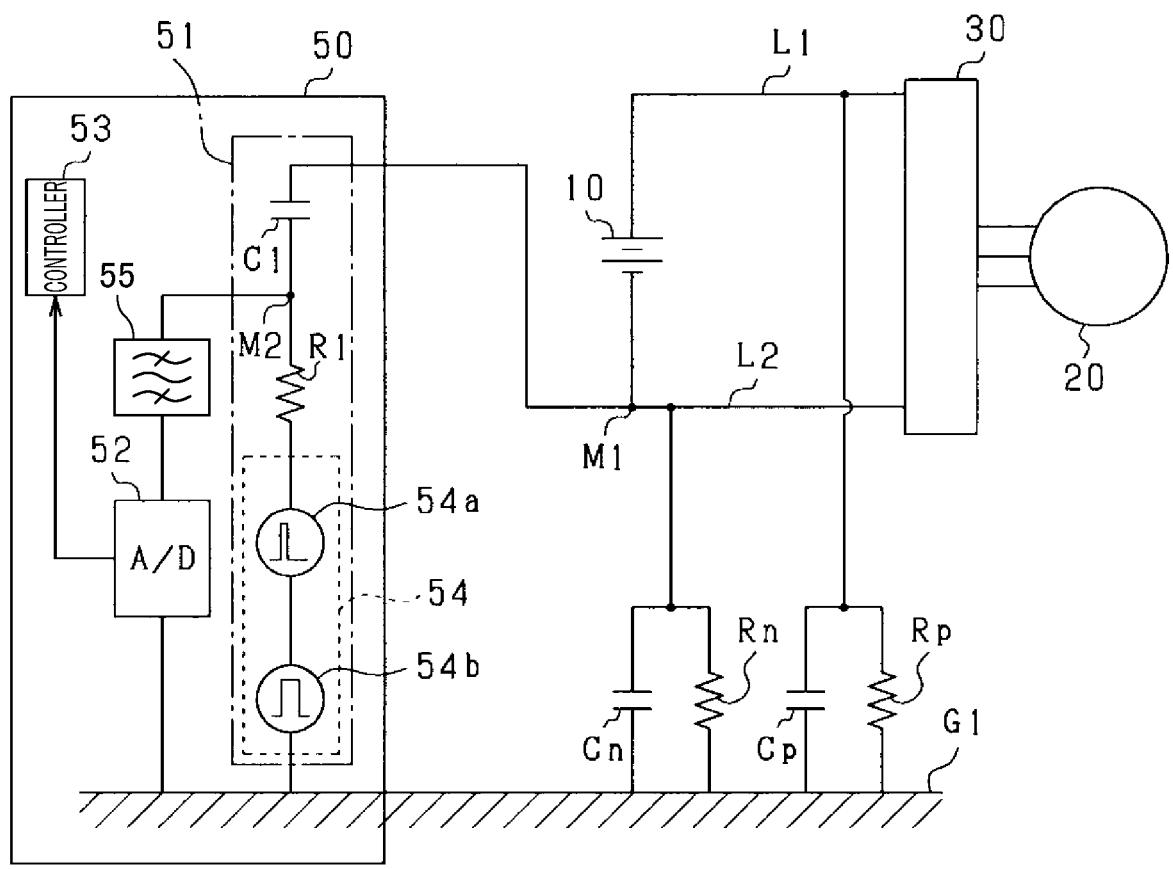
FIG. 20 is a diagram illustrating an electric circuit of an electrical leakage determination system as a modification of the first embodiment of the present disclosure.

In the above-described embodiments, to increase the absolute value of the AC voltage output during the preparation period, the detected voltage also needs to be increased sometimes. Particularly, when the ground fault resistance Rx is relatively small while the ground capacitance Cx is relatively large (in a case indicated by the broken line in FIG. 4B), there is a situation in which the absolute value of the detected voltage sometimes increases due to discharging of the ground capacitance Cx after the end of the preparation period. Hence, as illustrated in FIG. 20, the filter 55 may be provided to filter at least an excessive value than the absolute value (V1+V2) of the AC voltage during the preparation period. Subsequently, the controller 53 may input a voltage detected at the connection point (M2) via the filter 55. The filter 55 is preferably disposed between the connection point M2 and the A/D converter 52.

With this, influence of the AC voltage output during the preparation period can be suppressed. Also, influence of discharging of the ground capacitance Cx can be suppressed thereby enabling improvement of determination accuracy. Further, because the filter 55 is provided, it is not necessary to set a detection timing when a given period has elapsed after the end of the preparation period, a determination period can be shortened. Further, the voltage value to be filtered by the filter 55 is preferably adjusted appropriately based on a value of the AC voltage output during the preparation period and a length of the preparation period or the like. Specifically, the voltage value to be filtered is preferably increased as the voltage value of the AC voltage output during the preparation period increases. Also, the voltage value to be filtered is preferably increased as the preparation period extends. Still further, the voltage value to be filtered is preferably increased as a size of the ground capacitance Cx is expected to increase.

In the above-described various embodiments, the AC voltage output by the oscillator 54 changes polarity of a voltage. However, the AC voltage does not need to change the polarity of a voltage. For example, a voltage can be intermittently output as an AC voltage.

Further, in the above-described various embodiments, the detection timing is fixed at a time when a given period has elapsed after the preparation period ends. However, the detection timing can be fixed immediately after the preparation period ends. In such a situation, the voltage value of the AC voltage output during the preparation period and the length of the preparation period can be appropriately adjusted.

Further, In the above-described various embodiments, a waveform of the AC voltage is not limited to the above-described waveform. That is, a waveform may be arbitrarily changed as far as the absolute voltage value output during the preparation period is greater than the absolute voltage value at the detection timing.

Further, in the above-described various embodiments, although the assembled battery 10 is used as the DC power supply, a single battery can be used as the DC power supply in place of the assembled battery 10.

Further, the high-voltage circuit employed in the above-described various embodiments to determine if an electrical leakage occurs is not limited thereto and can be a high-voltage circuit that at least includes a DC power supply (a voltage source).

Further, in the above-described various embodiments, the timing when the preparation period starts is the same as the timing when the AC cycle starts. However, the timing when the preparation period starts can be arbitrarily changed to another timing as far as the other timing precedes the detection timing. For example, as illustrated in FIG. 7, the preparation period can be started at the time point T30 at which a given period has elapsed after the AC cycle starts. Specifically, when described in the first embodiment, the first pulse signal and the second pulse signal can overlap with each other at the time point T30 until when the given period has elapsed after the start of outputting the second pulse signal.

Further, in the above-described various embodiments, the oscillator 54 includes the first AC power supply 54a and the second AC power supply 54b. However, an optional voltage waveform application circuit can be employed to output a synthesized voltage of first and second pulse signals as well.

Further, in the above-described third embodiment, the ground capacitance Cx is calculated based on multiple detected voltages. however, the ground capacitance Cx can be measured in advance and the first pulse signal is set in accordance with the ground capacitance Cx.

Further, in the above-described various embodiments, multiple detected voltages are obtained by changing the voltage value V1 of the first pulse signal and either the ground capacitance Cx or the ground fault resistance Rx is specified based on the multiple detected voltages. However, the multiple detected voltages can be obtained by varying the voltage value V2 of the second pulse signal as well. Similarly, the multiple detected voltages can be obtained by varying either the period td from when application of the AC voltage starts until the detection timing or the period tp from when application of the AC voltage starts until the end of the preparation period. That is, either the ground capacitance Cx or the ground fault resistance Rx can be specified based on the detected voltages obtained by each of the modifications.

Further, by varying the period td from when application of the AC voltage starts until the detection timing, a period from when application of the AC voltage starts until the detection timing in which the second pulse signal is output is changed. Hence, by changing the period td, a type of the second pulse signal can substantially be changed.

Similarly, by vary the period tp from when application of the AC voltage starts until the end of the preparation period, a period when the first pulse signal is output is changed. Hence, by varying the period tp, a type of the first pulse signal can substantially be changed.

Further, in the above-described third to fifth embodiments and the other example, as far as the ground fault resistance Rx is specified, the ground capacitance Cx does not need to be specified.

Further, in the above-described third embodiment or fourth embodiment, one of the voltage values V1a and V1b of the first pulse signal can be zero.

Numerous additional modifications and variations of the present disclosure are possible in light of the above teachings. It is therefore to be understood that within the scope of the appended claims, the present disclosure may be executed otherwise than as specifically described herein. For example, the electrical leakage determination system is not limited to the above-described various embodiments and may be altered as appropriate.

What is claimed is:

1. An electrical leakage determination system to determine whether an electrical leakage occurs between a power supply path connected to a power supply terminal of a DC power supply and a ground, the electrical leakage determination system comprising:
   a coupling capacitor having a first end and a second end, the first end being connected to the power supply path;
   a resistor connected to the second end of the coupling capacitor;
   an oscillator connected to the resistor to output an AC voltage to the resistor, the AC voltage having a first amplitude as a peak of an absolute voltage value at a zero cross point during a half cycle and a second amplitude of an absolute voltage value lower than the first amplitude at a position other than the zero-cross point during the same half cycle in a same polarity, the oscillator outputting the AC voltage with the second amplitude to the resistor at a detection timing to allow the coupling capacitor to charge by storing electricity and generate a voltage generated at a connection point located between the coupling capacitor and the resistor; and
   a processor configured to detect the voltage generated at the connection point and determine whether the electrical leakage occurs based on the detected voltage, the connection point providing the voltage calculated by dividing the AC voltage output by the oscillator by a ratio between a resistance value of the resistor and a ground fault resistance between the power supply path and the ground at the detection timing,
   wherein the oscillator outputs the AC voltage having the first amplitude in a preparation period provided before the detection timing that charges at least a ground capacitance caused between the power supply path and the ground by storing electricity in the preparation period.

2. The electrical leakage determination system according to claim 1, wherein the oscillator maintains the polarity of the AC voltage from when the preparation period starts until an end of the detection timing.

3. The electrical leakage determination system according to claim 1, wherein the processor detects the voltage generated at the connection point when a given period has elapsed after an end of the preparation period.

4. The electrical leakage determination system according to claim 1, further comprising a filter to filter out at least an excessive absolute value from the AC voltage output during the preparation period,
   wherein the processor determines whether the electrical leakage occurs based on the detected voltage input to the processor via the filter.

5. The electrical leakage determination system according to claim 1, wherein:
   the oscillator includes a first AC power supply to output a voltage having a first rectangular wave and a second AC power supply to output a voltage having a second rectangular wave,
   the oscillator generates, as the first amplitude, a voltage having a first rectangular wave and a voltage having a second rectangular wave overlap each other and outputs, as the first amplitude, an overlapping result during the preparation period, and
   the oscillator outputs, as the second amplitude, only the voltage of the second rectangular wave from a time when the preparation period has elapsed until an end of the detection timing.

6. The electrical leakage determination system according to claim 1, wherein the oscillator outputs an AC voltage having a saw wave, the saw wave having a peak of an absolute voltage value acting as the first amplitude at a start of the preparation period and a portion in which the absolute voltage value gradually decreases subsequent to the peak per half cycle of the saw wave.

7. The electrical leakage determination system according to claim 1, wherein the first amplitude of the AC voltage output during the preparation period is changeable.

8. The electrical leakage determination system according to claim 1, wherein:
   the oscillator generates the first amplitude with a voltage having a first rectangular wave and a voltage having a second rectangular wave to overlap each other and outputs an overlapping result as the first amplitude during the preparation period, the oscillator outputs, as the second amplitude, only the voltage of the second rectangular wave from a time when the preparation period has elapsed until an end of the detection timing.

9. The electrical leakage determination system according to claim 8, wherein:
the processor is configured to designate different first and second types of the first rectangular wave output by the oscillator,
the oscillator generates a first AC voltage having the first rectangular wave of the first type designated by the processor and the second rectangular wave overlap each other, the oscillator outputting an overlapping portion as the first amplitude during the preparation period,
the oscillator generates a second AC voltage having the first rectangular wave of the second type designated by the processor and the second rectangular wave overlapping each other, the oscillator outputting an overlapping portion as the first amplitude during the preparation period,
the processor detects at least two voltages generated at the connection point based on the first and second AC voltages, and
the processor determines whether the electrical leakage occurs based on the type of the first rectangular wave and the at least two voltages detected at the connection point.

10. The electrical leakage determination system according to claim 9, wherein:
the processor specifies a ground fault resistance that allows the at least two voltages detected at the connection point to satisfy the following first to third equations, the processor determining whether the electrical leakage occurs based on the ground fault resistance specified,
V1 represents a voltage of the first rectangular wave, V2 represents a voltage of the second rectangular wave, and Rg represents a value of the ground fault resistance,
Cg represents a value of the ground capacitance, td represents a period from when application of AC voltage starts until a detection timing, and tp represents a period from when application of AC voltage starts until a preparation period ends,
Vrd(td) represents a voltage detected at a connection point, Vcg1 represents a voltage detected at the connection point M2 when only a first pulse signal is output, Vcg2 represents a voltage detected at the connection point M2 when only a second pulse signal is output, and Rd represents a resistance of the resistor R1, and $$Vrd(td) = Vcg1(td - tp) + Vcg2(td) \quad (1)$$

$$Vrcg1(td - tp) = \left(\frac{V1}{1 + Rd/Rg}\left[1 - \exp\left(-\frac{1 + Rd/Rd}{Cg \times Rd} \times tp\right)\right]\right) \times \exp\left(-\frac{1 + Rd/Rg}{Cg \times Rd} \times (td - tp)\right) \quad (2)$$

$$Vrcg2(td) = \frac{V2}{1 + Rd/Rg}\left[1 - \exp\left(-\frac{1 + Rd/Rd}{Cg \times Rd} \times td\right)\right] \quad (3)$$

11. The electrical leakage determination system according to claim 10, wherein:
the processor specifies the ground fault resistance with reference to an intersection point of a first ground capacitance as compared to ground fault resistance curve and a second ground capacitance as compared to ground fault resistance curve, and determines whether the electrical leakage occurs based on the ground fault resistance,
the first ground capacitance as compared to ground fault resistance curve obtained by substituting both of a first detected voltage detected at the connection point when the first rectangular wave having a first voltage value is output and the first voltage value of the first rectangular wave in each of the first to third equations, and
the second ground capacitance as compared to ground fault resistance curve obtained by substituting both of a second detected voltage detected at the connection point when the first rectangular wave having a second voltage value is output and the second voltage value of the first rectangular wave in each of the first to third equations.

12. The electrical leakage determination system according to claim 8, wherein:
the processor is configured to designate at least two different first and second types of the first rectangular wave,
the oscillator generates a voltage having the first rectangular wave of the type designated by the processor and the voltage having the second rectangular wave overlap each other, the oscillator outputting an overlapping result during the preparation period,
when the ground capacitance is not specified, the processor detects at least two voltages at the connection point generated when the at least two different first and second types of the first rectangular wave are output from the oscillator, respectively, and specifies the ground capacitance based on the at least two different first and second types of the first rectangular wave and the at least two voltages correspondingly detected at the connection point, and
when the ground capacitance has been specified, the processor designates a type of the first rectangular wave corresponding to the ground capacitance.

13. The electrical leakage determination system according to claim 8, wherein:
the processor is configured to set at least two different types of the first rectangular wave,
the processor is configured to obtain a reference line indicating a relation between a voltage detected at the connection point and a ground fault resistance, the reference line being established when both of the voltage of the first rectangular wave and the ground capacitance are approximately zeros, respectively,
the oscillator generates a voltage having the first rectangular wave of the type set by the processor and the voltage having the second rectangular wave overlap each other, the oscillator outputting an overlapping result during the preparation period,
the processor specifies and sets a true value as an appropriate voltage value of the first rectangular wave to allow the ground fault capacitor to sufficiently charge during the preparation period by repeatedly changing the voltage value of the first rectangular wave to bring the relation between the voltage detected at the connection point and the ground fault resistance to approximate the reference line.

14. The electrical leakage determination system according to claim 13, wherein:

the processor obtains both of a measured value of a ground capacitance and a calibration line indicating a relation between the voltage value of the first rectangular wave and the ground fault resistance, the calibration line determined to cause the relation between the voltage detected at the connection point and the ground fault resistance to match the reference line when the ground capacitance is supposed to have the measured value, the processor designates a provisional value as the voltage value of the first rectangular wave when the true value of the first rectangular wave is not specified, the processor specifies a first ground fault resistance based on the voltage detected at the connection point when the provisional value is output from the oscillator with reference to the reference line, the processor specifies a second ground fault resistance with reference to the calibration line corresponding to the provisional value, and the processor specifies the true voltage value of the first rectangular wave based on a result of comparison between the first ground fault resistance and the second ground fault resistance, when a difference between the first ground fault resistance and the second ground fault resistance falls within a given range.

15. The electrical leakage determination system according to claim 14, wherein:

the processor calculates an intermediate value between the first ground fault resistance and the second ground fault resistance when the difference between the first ground fault resistance and the second ground fault resistance is out of the given range, the processor specifies a voltage value corresponding to the intermediate value with reference to the calibration line and newly designates the voltage value as specified as a new provisional value, the processor obtains again a new first ground fault resistance and a new second ground fault resistance, and the processor designates the new provisional value as the true voltage value of the first rectangular wave when the difference between the first ground fault resistance and the second ground fault resistance falls within the given range.

16. The electrical leakage determination system according to claim 14, wherein the processor specifies a ground fault resistance corresponding to the true value with reference to the calibration line and determines whether the electrical leakage occurs based on the ground fault resistance as specified when the true voltage value of the first rectangular wave is designated by the processor.

* * * * *